US012733411B2

(12) United States Patent
Li et al.

(10) Patent No.: US 12,733,411 B2
(45) Date of Patent: Sep. 8, 2026

(54) PHASE CHANGE MATERIAL SWITCH WITH OVONIC THRESHOLD SWITCHING MATERIAL SELECTOR AND METHODS FOR FORMING THE SAME

(71) Applicant: Taiwan Semiconductor Manufacturing Company Limited, Hsinchu (TW)

(72) Inventors: Hung-Ju Li, Hsinchu City (TW); Kuo-Ching Huang, Hsinchu City (TW); Yu-Wei Ting, Taipei City (TW); Kuo-Pin Chang, Zhubei City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 585 days.

(21) Appl. No.: 18/327,432

(22) Filed: Jun. 1, 2023

(65) Prior Publication Data

US 2024/0276893 A1 Aug. 15, 2024

Related U.S. Application Data

(60) Provisional application No. 63/445,711, filed on Feb. 14, 2023.

(51) Int. Cl.
*H10N 70/20* (2023.01)
*H10N 70/00* (2023.01)

(52) U.S. Cl.
CPC ......... *H10N 70/231* (2023.02); *H10N 70/011* (2023.02); *H10N 70/8413* (2023.02); *H10N 70/8828* (2023.02)

(58) Field of Classification Search
CPC ............... H10N 70/231; H10N 70/011; H10N 70/8413; H10N 70/063; H10N 70/253
See application file for complete search history.

(56) References Cited

U.S. PATENT DOCUMENTS 9,368,720 B1 * 6/2016 Moon ................ H10N 70/8828
10,461,253 B1 * 10/2019 Slovin .................. H10N 70/231
(Continued)

FOREIGN PATENT DOCUMENTS

CN 114566591 A 5/2022
KR 1020190064390 A 6/2019
(Continued)

OTHER PUBLICATIONS

German Patent and Trademark Office; DE Application No. 102023129178.5; first Examination Report mailed Aug. 13, 2024; 16 pages.

(Continued)

*Primary Examiner* — Mounir S Amer
(74) *Attorney, Agent, or Firm* — The Marbury Law Group, PLLC

(57) ABSTRACT

Phase change material (PCM) switches and methods of fabrication thereof that include a phase change material layer and a selector having a first electrode and an ovonic threshold switching (OTS) material layer. The first electrode may selectively apply a bias voltage to the OTS layer, causing localized heating within the OTS layer. The phase change material layer may be in thermal contact with the OTS layer such that the OTS layer may heat an active region of the phase change material layer. By controlling the voltage applied to the first electrode and the resultant heating within the OTS layer, the active region of the phase change material layer may be selectively transitioned between a high resistivity state and a low resistivity state. A PCM switch according to various embodiments may enable low power and fast switching between high resistivity and low resistivity states and reduced parasitic capacitance.

20 Claims, 31 Drawing Sheets

(56) References Cited

U.S. PATENT DOCUMENTS

| | | | | |
|---|---|---|---|---|
| 10,644,235 | B2 * | 5/2020 | El-Hinnawy | H10N 70/8613 |
| 10,686,130 | B2 | 6/2020 | Howard et al. | |
| 10,862,032 | B2 * | 12/2020 | Rose | H10N 70/231 |
| 12,525,553 | B2 * | 1/2026 | Kobayashi | H10W 44/20 |
| 2006/0246712 | A1 | 11/2006 | Kim et al. | |
| 2009/0095951 | A1 | 4/2009 | Kostylev et al. | |
| 2012/0049144 | A1 | 3/2012 | Franceschini et al. | |
| 2016/0071653 | A1 * | 3/2016 | Lamorey | H05B 3/0004<br>216/6 |
| 2017/0117328 | A1 * | 4/2017 | Terai | H10N 70/826 |
| 2017/0372779 | A1 | 12/2017 | O'Toole et al. | |
| 2019/0165264 | A1 * | 5/2019 | Wu | H10B 63/10 |
| 2020/0058581 | A1 * | 2/2020 | El-Hinnawy | H01L 23/5222 |
| 2020/0058869 | A1 | 2/2020 | Slovin et al. | |
| 2022/0069211 | A1 | 3/2022 | Lung et al. | |
| 2023/0093604 | A1 * | 3/2023 | Ok | H10N 70/231<br>257/4 |
| 2024/0397733 | A1 * | 11/2024 | Hsieh | H10B 63/80 |

FOREIGN PATENT DOCUMENTS

| | | | |
|---|---|---|---|
| KR | 1020210061903 | A | 5/2021 |
| KR | 1020230008006 | A | 1/2023 |
| TW | I773165 | B | 8/2022 |

OTHER PUBLICATIONS

Korean Patent and Trademark Office; KR Application No. 10-2023-0170713; Office Action mailed Jan. 6, 2025; 14 pages.

Korean Patent and Trademark Office; KR Application No. 10-2023-0170713; 2nd Office Action mailed Sep. 23, 2025; 6 pages.

Korean Patent and Trademark Office; KR Application No. 10-2023-0170713; 3rd Office Action mailed Feb. 20, 2026; 8 pages.

Jianq Chyun Intellectual Property Office; TW Application No. 112127667; Office Action mailed Mar. 21, 2024; 10 pages.

* cited by examiner hd1
102
160
133b
131b
135b
107
106
104
101
105
133a
131a
135a

PHASE CHANGE MATERIAL SWITCH WITH OVONIC THRESHOLD SWITCHING MATERIAL SELECTOR AND METHODS FOR FORMING THE SAME

RELATED APPLICATIONS

This application claims the benefit of priority from U.S. Provisional Application Ser. No. 63/445,711, entitled "A new type of RF switch combined with OTS selector with low power, fast switching speed and low Off-state Capacitance," filed on Feb. 14, 2023, the entire contents of which is incorporated herein by reference.

BACKGROUND

Phase change material (PCM) switches are used for various applications such as radio-frequency applications. Advantages of PCM switches include their immunity to interference by electromagnetic radiation, relatively fast switching times, and ability to maintain their switching state (i.e., "On" or "Off") without consuming electrical power.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
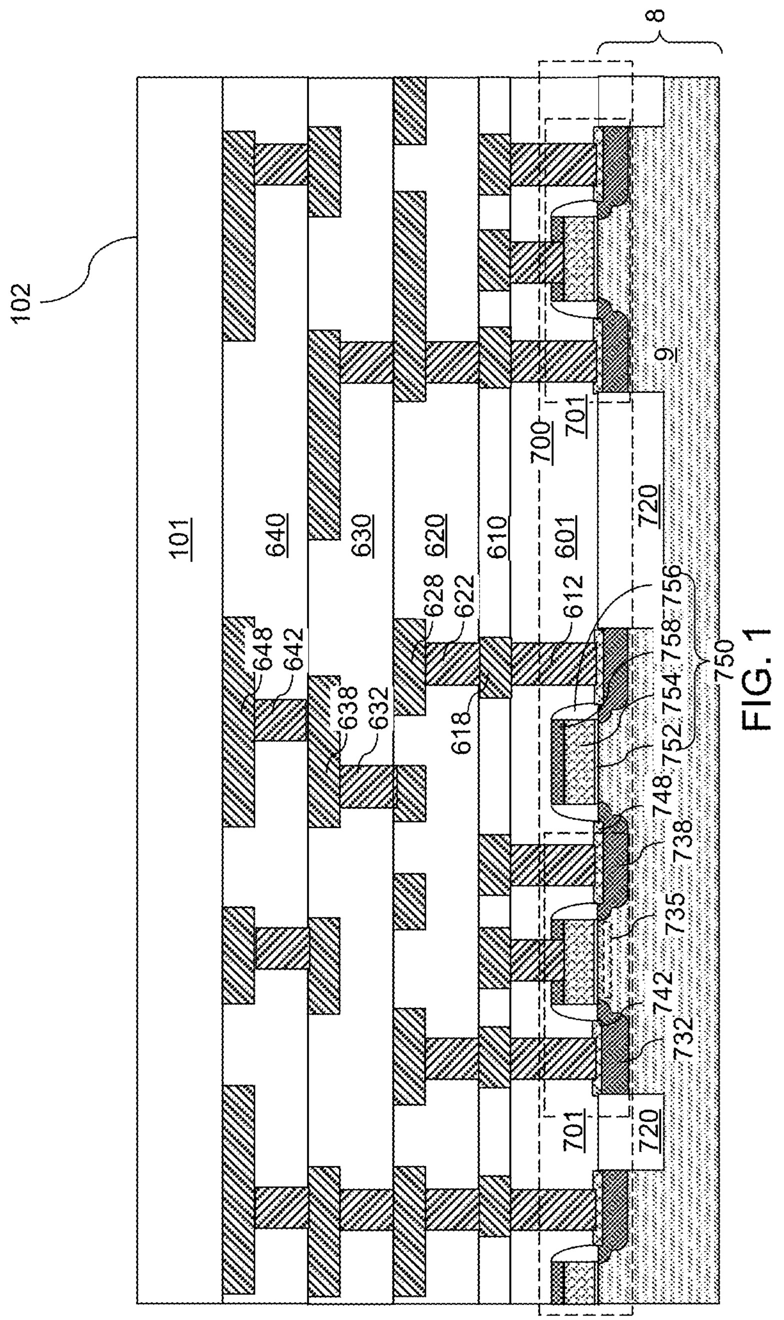
FIG. 1 is a vertical cross-sectional view of a first structure after formation of complementary metal-oxide-semiconductor (CMOS) transistors, metal interconnect structures and dielectric material layers according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Generally, the various embodiment structures and methods of the present disclosure may be used to form a phase change material (PCM) switch, which may be used to provide a switching function for various semiconductor devices such as radio-frequency semiconductor devices, varactors (i.e., variable capacitance capacitors), inductors, or other semiconductor devices. A PCM switch in accordance with various embodiments may include an ovonic threshold switching (OTS) material selector as described in further detail below.

As used herein, a "phase change material" refers to a material having at least two different phases providing different resistivity. The different phases may include an amorphous state having high resistivity and a crystalline state having low resistivity (i.e., a lower resistivity than in the amorphous state). The transition between the amorphous state and the crystalline state may be induced by controlling a time-versus-temperature thermal profile within the phase change material. In particular, a PCM switch may include a selector component that is configured to selectively induce heating in the phase change material to cause the phase change material to transition between a low resistivity state and a high resistivity state. In some PCM switches, the selector component may include a resistive heating element thermally coupled to the phase change material and configured to selectively heat the phase change material via the application of current pulses through the resistive heating element.

To induce a transition of the phase change material from a low-resistivity crystalline state to a high-resistivity amorphous state, the current pulse through the resistive heating element may have a relatively short pulse width with a short falling time that is configured to quickly heat the phase change material to a temperature above its melting temperature ($T_{melt}$), causing the material to transition from an ordered crystalline low-resistivity phase to a disordered amorphous high-resistivity phase. The short falling time of the pulse promotes rapid quenching and inhibits re-crystallization of the material as it cools.

To induce a transition of the phase change material from a high-resistivity amorphous state to a low-resistivity crystalline state, the current pulse through the resistive heating element may have a relatively longer pulse width with a longer pulse falling time that is configured to heat the phase change material to a temperature above its crystallization temperature ($T_{crys}$), but below its melting temperature ($T_{melt}$), over a time period sufficient to induce crystal nucleation in the material. The comparatively long falling time of the current pulse promotes crystal growth as the phase change material cools at a relatively slower rate.

A PCM switch may include a phase change material disposed within a signal transmission pathway between a pair of electrodes. The resistive heating element may extend across the phase change material in a direction transverse to the signal transmission pathway, and a layer of electrically-insulating and thermally-conductive material may be disposed between the resistive heating element and the phase change material. While the phase change material is in a low-resistivity crystalline state, the PCM switch may be in an "On" state such that signals may be transmitted across the phase change material between the pair of electrodes. However, in instances in which a portion of the phase change material along the signal transmission pathway is in a high-resistivity amorphous state, the PCM switch may be in an "Off" state such that signal transmission between the pair of electrodes is blocked. The PCM switch may be switched (i.e., programmed) between the "On" state and the "Off" state by the selective application of current pulses to the resistive heating element having different pulse widths and falling times as described above. The portion of the phase change material that is switched between a low-resistivity crystalline state and a high-resistivity amorphous state may be referred to as the active region of the phase change material.

For a switch used in radio-frequency (RF) applications, relevant factors for evaluating switch performance may include insertion loss, isolation and power handling. In general, low insertion loss and high isolation are desirable characteristics for RF switches. For PCM switches, insertion loss is related to the resistivity across the phase change material when the switch is in the "On" state (i.e., $R_{ON}$), while high isolation is inversely related to the capacitance of the switch while in the "Off" state (i.e., $C_{OFF}$). A figure of merit (FOM) used to characterize PCM switch performance may be inversely proportional to the product $R_{ON}*C_{OFF}$. For example, one FOM that is used to characterize switch performance is $\sim 1/(2\pi R_{ON}C_{OFF})$, where a higher FOM value equals better switch performance. Thus, switch performance may be improved by reducing the $R_{ON}$ characteristics, the $C_{OFF}$ characteristics, or both, in a PCM switch.

Existing designs for PCM switches are not optimally efficient because only a fraction of the total thermal energy generated by the resistive heating element is utilized for heating the active region of the phase change material. The remaining thermal energy is diffused into other portions of the PCM switch and/or surrounding material(s). Accordingly, a high bias voltage across the resistive heating element may be needed to provide sufficient heating to induce the desired phase change in the active region of the phase change material. This may increase the total power used by the PCM switch during switching operations.

In addition, in some PCM switches, the dielectric material layer located between the resistive heating element and the phase change material is typically made relatively thin to promote heat conduction through the dielectric material layer to the active region of the phase change material. However, the thickness of the dielectric material layer is inversely proportional to the $C_{OFF}$ characteristics of the PCM switch, meaning that a thin dielectric material layer between the resistive heating element and the phase change material may increase the $C_{OFF}$ of the PCM switch and thereby result in poorer switch performance.

In order to address these deficiencies, various embodiments disclosed herein include PCM switches having a selector that includes an ovonic threshold switching (OTS) material. OTS materials are a type of solid-state dielectric materials, such as chalcogenide glass materials, that may be switchable between a relatively higher resistivity state and a relatively lower resistivity state based on the application of a suitable bias voltage. The bias voltage may produce an electric field within the OTS material, which may enable electron transport via shallow traps within the OTS material. In regions of the OTS material that contain a relatively higher number of defects, conductive pathways, or "filaments" may begin to form within the OTS material. Current crowding in the one or more filaments may produce localized heating within the OTS material.

A selector for a PCM switch may include a first electrode and a layer of OTS material. The first electrode may be used to selectively apply a bias voltage to the OTS layer, causing localized heating within the OTS layer. The phase change material layer may be in thermal contact with the OTS layer such that the localized heating within the OTS layer may heat an active region of the phase change material layer. By controlling the voltage applied to the first electrode and the resultant heating within the OTS layer, a thermal profile within active region of the phase change material layer may be controlled to selectively transition the active region of the phase change material layer between a high resistivity state and a low resistivity state.

In various embodiments, by providing a selector for a PCM switch that utilizes localized heating in an OTS layer, the active region of the adjacent phase change material layer that is switchable between a low resistivity state and a high resistivity state may be confined to a relatively small region. Accordingly, less power may be used in switching the active region between a high resistivity state and a low resistivity state, and faster switching times (e.g., ~20 nanoseconds or less) may be achievable. In addition, because the internally-heated OTS layer may be in direct thermal contact with the phase change material layer, the OTS layer may be made relatively thick, which may reduce the $C_{OFF}$ and improve the performance of the PCM switch.

FIG. 1 is a vertical cross-sectional view of a first exemplary structure prior to formation of a PCM switch according to various embodiments of the present disclosure. The first exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source electrode 732, a drain electrode 738, a semiconductor channel 735 that includes a surface portion of the substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738. The devices formed on the top surface of the semiconductor material layer 9 may include complementary metal-oxide-semiconductor (CMOS) transistors and optionally additional semiconductor devices (such as resistors, diodes, capacitor structures, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. If the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a subset of the field effect transistors 701 in the CMOS circuitry 700 may include a respective node that is subsequently electrically connected to a node of a PCM switch to be subsequently formed.

In one embodiment, the substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant.

Various metal interconnect structures formed within dielectric material layers may be subsequently formed over the substrate 8 and the semiconductor devices 701 thereupon (such as field effect transistors). In an illustrative example, the dielectric material layers may include, for example, a first dielectric material layer 601 that may be a layer that surrounds the contact structure connected to the source and drains (sometimes referred to as a contact-level dielectric material layer 601), a first interconnect-level dielectric material layer 610, a second interconnect-level dielectric material layer 620, a third interconnect-level dielectric material layer 630, and a fourth interconnect-level dielectric material layer 640. The metal interconnect structures may include device contact via structures 612 formed in the first dielectric material layer 601 and contact a respective component of the CMOS circuitry 700, first metal line structures 618 formed in the first interconnect-level dielectric material layer 610, first metal via structures 622 formed in a lower portion of the second interconnect-level dielectric material layer 620, second metal line structures 628 formed in an upper portion of the second interconnect-level dielectric material layer 620, second metal via structures 632 formed in a lower portion of the third interconnect-level dielectric material layer 630, third metal line structures 638 formed in an upper portion of the third interconnect-level dielectric material layer 630, third metal via structures 642 formed in a lower portion of the fourth interconnect-level dielectric material layer 640, and fourth metal line structures 648 formed in an upper portion of the fourth interconnect-level dielectric material layer 640. While the present disclosure is described using an embodiment in which four levels metal line structures are formed in dielectric material layers, embodiments are expressly contemplated herein in which a lesser or greater number of levels of metal line structures are formed in dielectric material layers.

Each of the dielectric material layers (601, 610, 620, 630, 640) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 631, 638, 642, 648) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 622 and the second metal line structures 628 may be formed as integrated line and via structures by a dual damascene process. Generally, any contiguous set of a metal line structure (628, 638, 648) and at least one underlying metal via structure (622, 632, 642) may be formed as an integrated line and via structure.

Generally, semiconductor devices 701 may be formed on a substrate 8, and metal interconnect structures (612, 618, 622, 628, 631, 638, 642, 648) and dielectric material layers (601, 610, 620, 630, 640) over the semiconductor devices 701. The metal interconnect structures (612, 618, 622, 628, 631, 638, 642, 648) may be formed in the dielectric material layers (601, 610, 620, 630, 640), and may be electrically connected to the semiconductor devices.

Referring again to FIG. 1, a first dielectric material layer 101 may be formed over the metal interconnect structures (612, 618, 622, 628, 631, 638, 642, 648) and dielectric material layers (601, 610, 620, 630, 640). The first dielectric material layer 101 may include a suitable dielectric material, such as silicon oxide, undoped silicate glass, a doped silicate glass, organosilicate glass, amorphous fluorinated carbon, porous variants thereof, or combinations thereof. Other suitable dielectric materials are within the contemplated scope of disclosure. The first dielectric material layer 101 may be deposited using any suitable deposition process, such a chemical vapor deposition (CVD), physical vapor deposition (PVD), atomic layer deposition (ALD), high density plasma CVD (HDPCVD), metalorganic CVD (MOCVD), plasma enhanced CVD (PECVD), sputtering, laser ablation, or the like. The first dielectric material layer 101 may include a planar upper surface 102.

Figure 2:
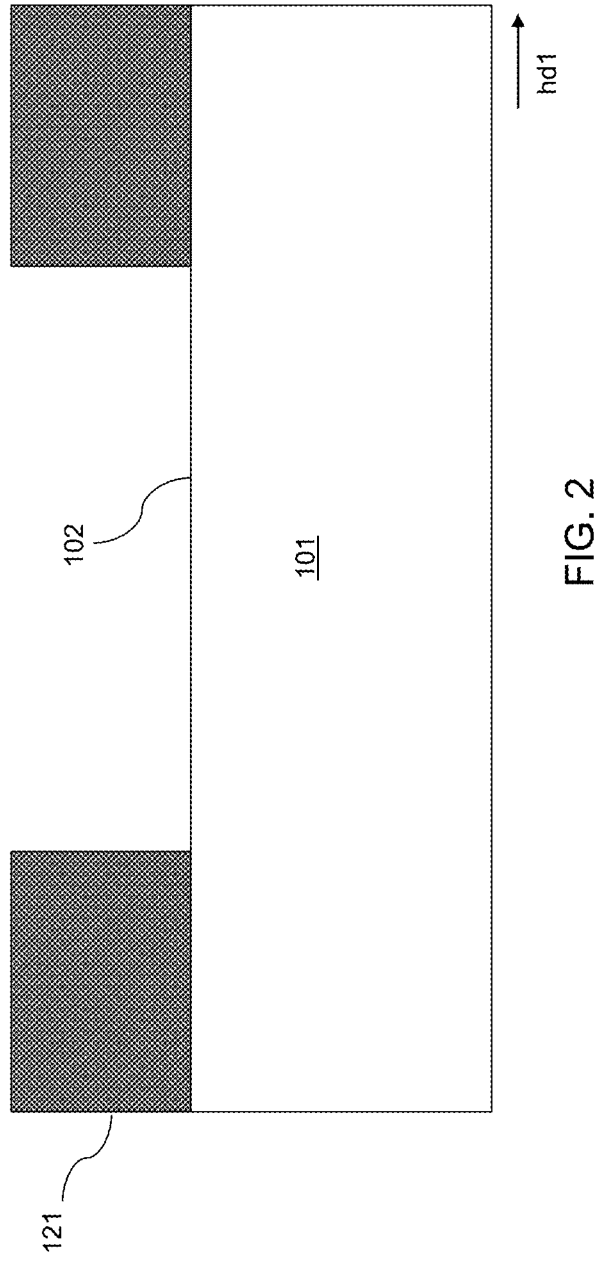
FIG. 2 is a vertical cross-section view of an intermediate structure during a process of forming a phase change material (PCM) switch that includes a patterned mask over the upper surface of a first dielectric material layer according to an embodiment of the present disclosure.

FIG. 2 is a vertical cross-section view of an intermediate structure during a process of forming a PCM switch that includes a patterned mask 121 over the upper surface 102 of a first dielectric material layer 101 according to an embodiment of the present disclosure. In various embodiments, the first dielectric material layer 101 may be the uppermost layer of an exemplary structure that includes CMOS circuitry, metal interconnect structures and dielectric material layers over a substrate such as shown in FIG. 1. Referring to FIG. 2, the patterned mask 121, which may include a layer of photoresist and/or a hard mask, may be patterned using a photolithographic technique to form an opening through the mask corresponding to the location of a selector for a PCM switch to be subsequently formed.

Figure 3:
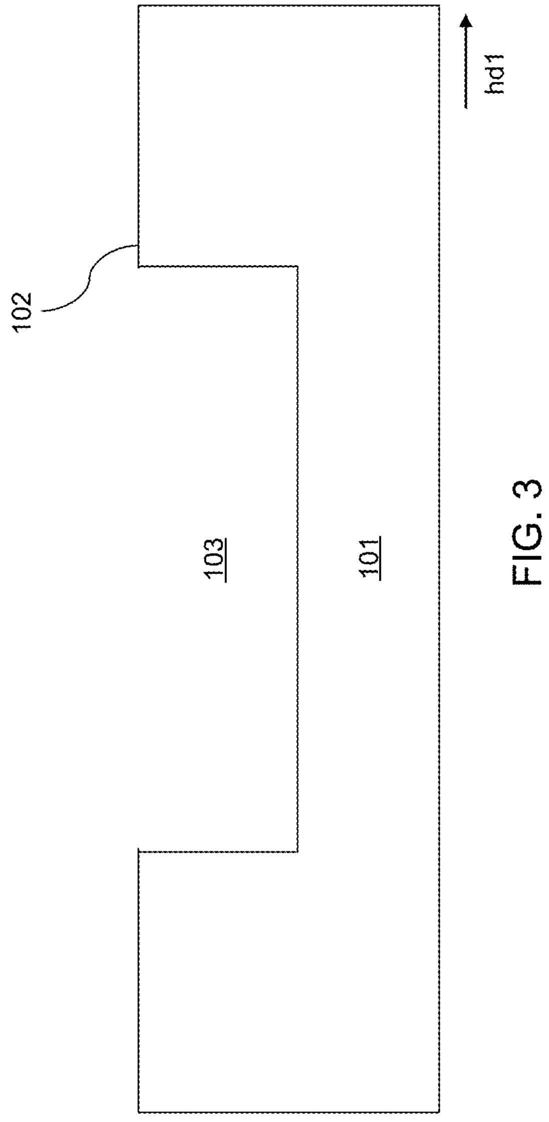
FIG. 3 is a vertical cross-section view of an intermediate structure during a process of forming a PCM switch illustrating a trench formed in the first dielectric material layer according to an embodiment of the present disclosure.

FIG. 3 is a vertical cross-section view of an intermediate structure during a process of forming a PCM switch illustrating a trench 103 formed in the first dielectric material layer 101 according to an embodiment of the present disclosure. Referring to FIG. 3, an anisotropic etch process, such as a reactive ion etch process, may be performed to etch a portion of the dielectric material layer 101 exposed through the opening in the patterned mask 121 and form the trench 103 in the first dielectric material layer 101. In the exemplary intermediate structure shown in FIG. 3, the trench 103 has a rectangular cross-section shape in a plane extending along horizontal direction hd1, including a horizontal bottom surface and vertically-extending sidewalls. However, it will be understood that the trench 103 may have a different cross-sectional shape, such as a trapezoidal cross-section shape, and the sidewalls of the trench may include angled or curved surfaces. Following the etching process, the patterned mask 121 may be removed using a suitable process, such as via ashing or dissolution using a solvent.

Figure 4:
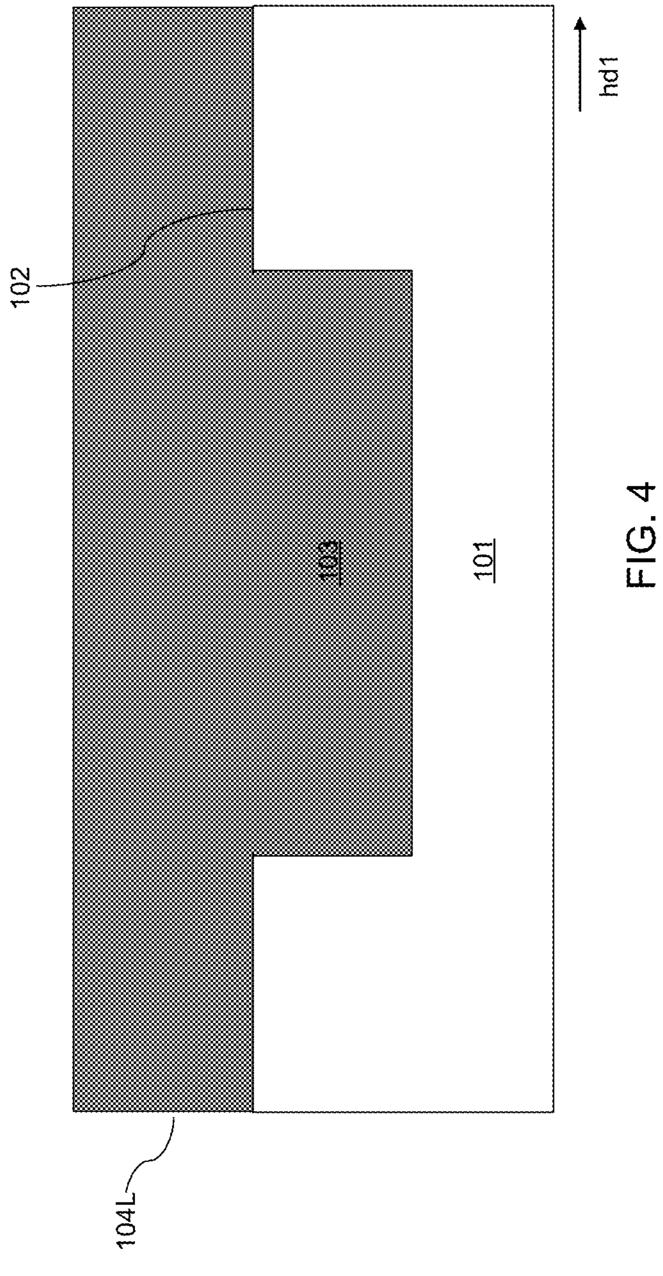
FIG. 4 is a vertical cross-section view of an intermediate structure during a process of forming a PCM switch illustrating a continuous electrode layer formed over the upper surface of the first dielectric material layer and within the trench according to an embodiment of the present disclosure.

FIG. 4 is a vertical cross-section view of an intermediate structure during a process of forming a PCM switch illustrating a continuous electrode layer 104L formed over the upper surface 102 of the first dielectric material layer 101 and within the trench 103 according to an embodiment of the present disclosure. Referring to FIG. 4, the continuous electrode layer 104L may include a metallic material having relatively low electrical resistivity, such as tungsten, tungsten nitride, nickel silicide, and/or aluminum. Other suitable materials for the continuous electrode layer 104L are within the contemplated scope of disclosure. The continuous electrode layer 104L may be deposited using a suitable deposition process, such as physical vapor deposition (PVD), sputtering, chemical vapor deposition (CVD), atomic layer deposition (ALD), plasma-enhanced chemical vapor deposition (PECVD), electrochemical deposition, or combinations thereof.

Figure 5A:
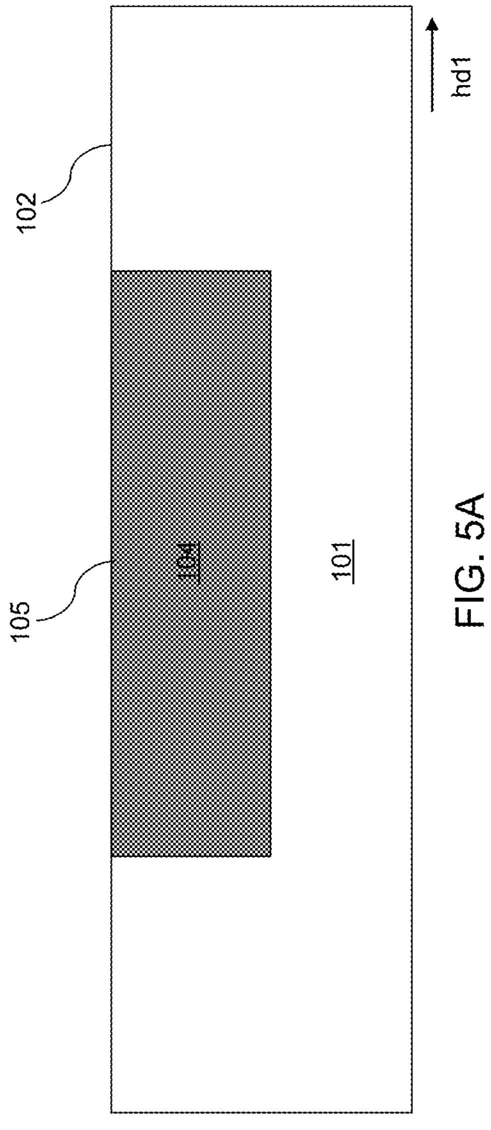
FIG. 5A is a vertical cross-section view of an intermediate structure during a process of forming a PCM switch illustrating a first electrode embedded within the first dielectric material layer according to an embodiment of the present disclosure.
Figure 5B:
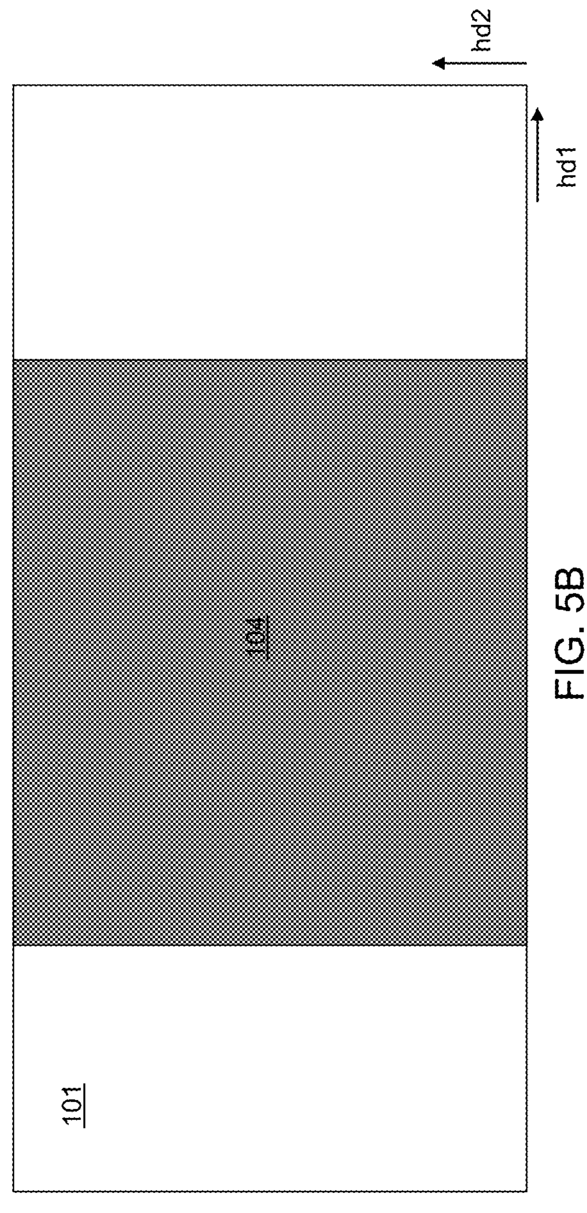
FIG. 5B is a top view of the intermediate structure of FIG. 5A.

FIG. 5A is a vertical cross-section view of an intermediate structure during a process of forming a PCM switch illustrating a first electrode 104 embedded within the first dielectric material layer 101 according to an embodiment of the present disclosure. FIG. 5B is a top view of the exemplary intermediate structure of FIG. 5A. Referring to FIGS. 5A and 5B, a planarization process, such as a chemical mechanical planarization (CMP) process may be used to remove the continuous electrode layer 104L from over the upper surface 102 of the first dielectric material layer 101. The remaining portion of the continuous electrode layer 104L may form a discrete first electrode 104 that may fill the trench 103 in the first dielectric material layer 101. The first dielectric material layer 101 may surround the first electrode 104 over the bottom surface and lateral side surfaces of the first electrode 104. The upper surface 105 of the electrode 104 may be coplanar with the upper surface 102 of the first dielectric material layer 101. The first electrode 104 may form a portion of a selector for a PCM switch to be subsequently formed over the first electrode 104 and the upper surface 102 of the first dielectric material layer 102, and the first electrode 104 may also be referred to as a bottom electrode 104.

Figure 6:
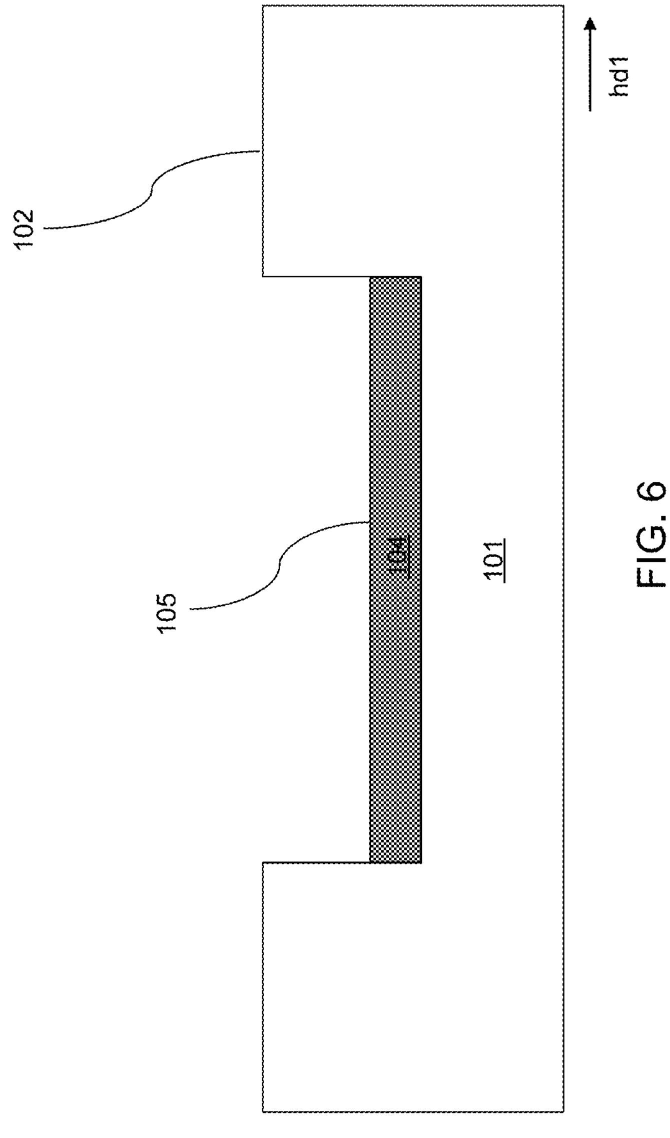
FIG. 6 is a vertical cross-section view of an intermediate structure during a process of forming a PCM switch illustrating the upper surface of the first electrode vertically recessed with respect to the upper surface of the first dielectric material layer according to an embodiment of the present disclosure.

FIG. 6 is a vertical cross-section view of an intermediate structure during a process of forming a PCM switch illustrating the upper surface 105 of the first electrode 104 vertically recessed with respect to the upper surface 102 of the first dielectric material layer 101 according to an embodiment of the present disclosure. Referring to FIG. 6, an etching process may be performed that may selectively etch the material of the first electrode 104 relative to the material of the first dielectric material layer 101. Following the etching process, the upper surface 105 of the first electrode 104 may be vertically recessed with respect to the upper surface 102 of the first dielectric material layer 101. In various embodiments, the upper surface 105 of the first electrode 104 may be vertically recessed with respect to the upper surface 102 of the first dielectric material layer 101 by a distance that is between about 1 nm and about 1 μm, such as between about 10 nm and about 500 nm, although lesser and greater recess distances may also be used. In some embodiments, the upper surface 105 of the first electrode 104 may be vertically recessed with respect to the upper surface 102 of the first dielectric material layer 101 by a distance that is greater than about 60 nm, such as greater than about 100 nm.

Figure 7:
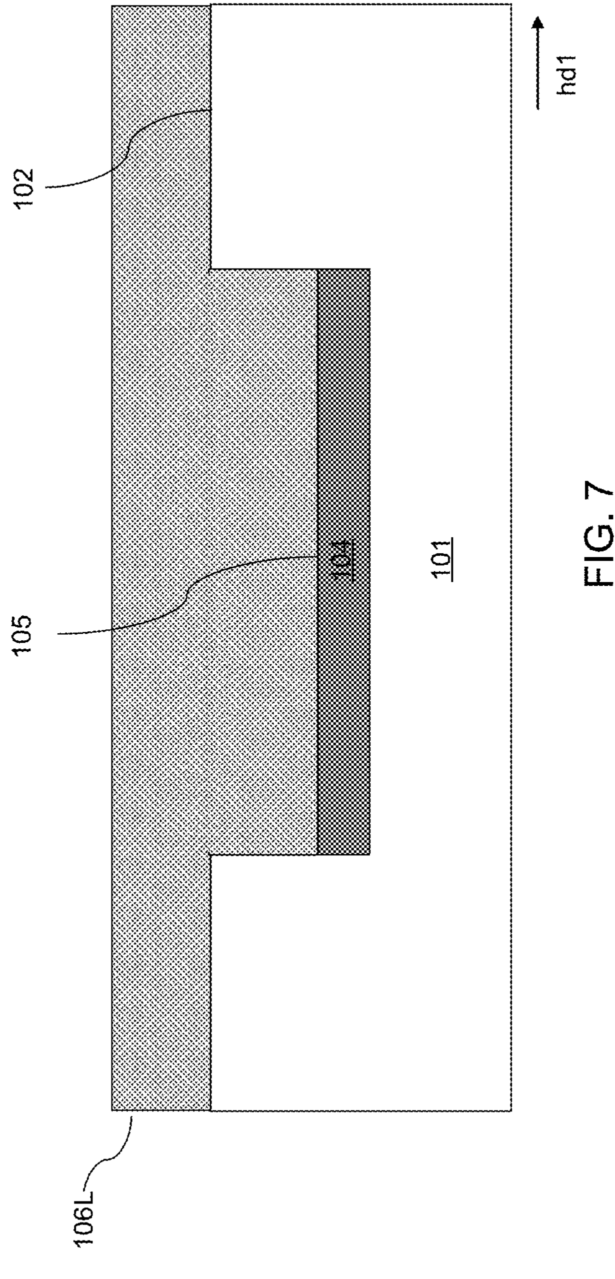
FIG. 7 is a vertical cross-section view of an intermediate structure during a process of forming a PCM switch showing a continuous ovonic threshold switching (OTS) layer formed over the upper surface of the first dielectric material layer and over the upper surface of the first electrode according to an embodiment of the present disclosure.

FIG. 7 is a vertical cross-section view of an intermediate structure during a process of forming a PCM switch showing a continuous ovonic threshold switching (OTS) layer 106L formed over the upper surface 102 of the first dielectric material layer 101 and over the upper surface 105 of the first electrode 104 according to an embodiment of the present disclosure. Referring to FIG. 7, the continuous OTS layer 106L may be deposited over the upper surface 102 of the first dielectric material layer 101 and over the vertically-recessed upper surface 105 of the first electrode 104.

The continuous OTS layer 106L may be formed of a solid-state dielectric material, such as a chalcogenide glass, that may be switchable between a relatively higher resistivity state and a relatively lower resistivity state based on the application of a suitable bias voltage. Suitable materials for the continuous OTS layer 106L may include a selenium-containing compound, a tellurium-containing compound, and/or a germanium-containing compound, which may include, without limitation, GeSe, GeSeN, GeSeSb, GeSeSbN, ZnTe, AlTe, BCTeN, BCGaTeO, including combinations thereof. Other suitable materials for the continuous OTS layer 106L are within the contemplated scope of disclosure. The continuous OTS layer 106L may be deposited using a suitable deposition process as described above.

Figure 8A:
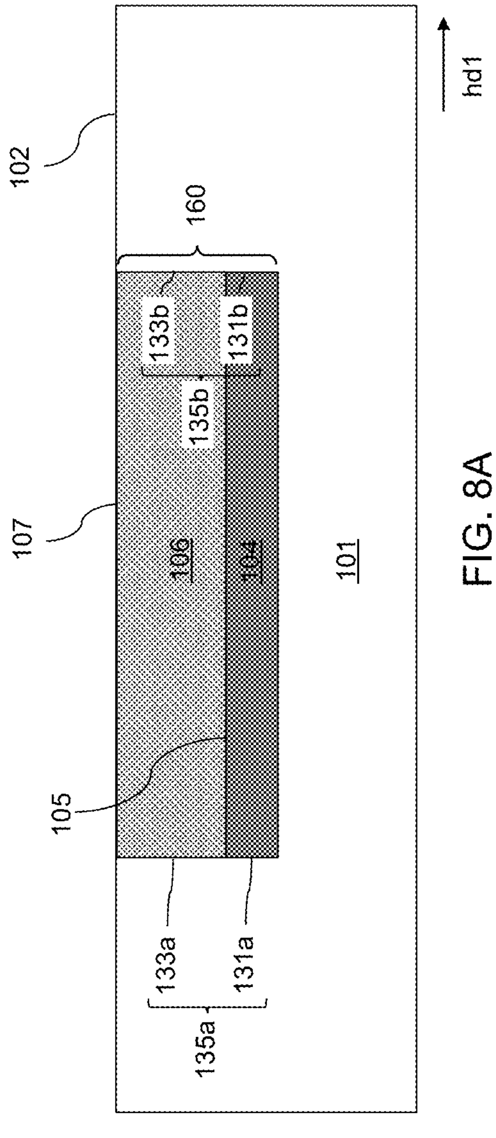
FIG. 8A is a vertical cross-section view of an intermediate structure during a process of forming a PCM switch illustrating an OTS layer over the first electrode according to an embodiment of the present disclosure.
Figure 8B:
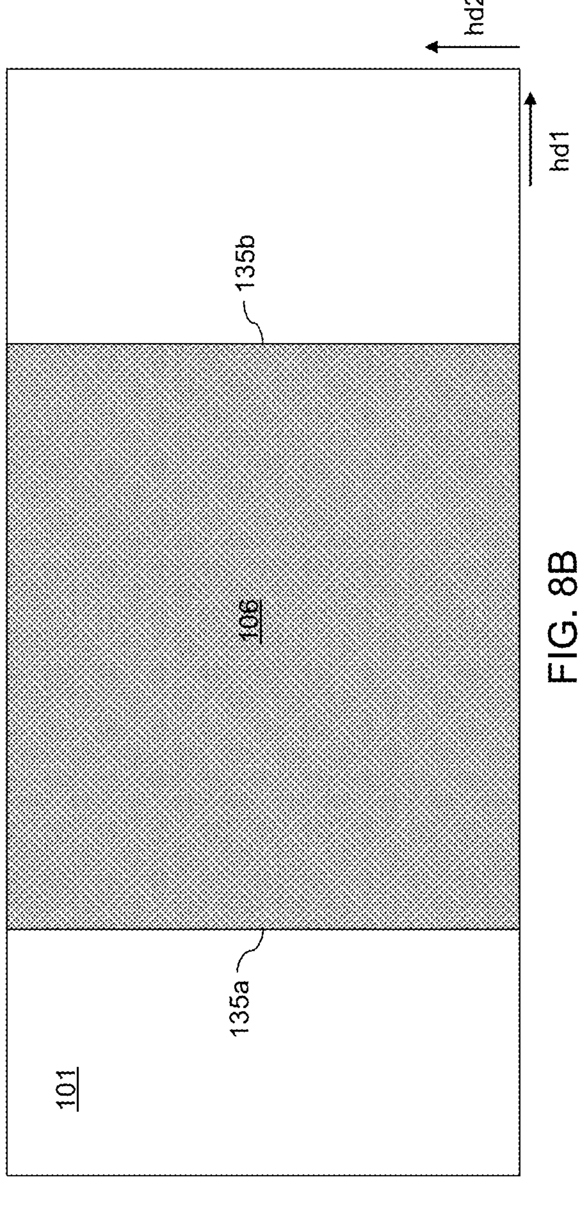
FIG. 8B is a top view of the intermediate structure of FIG. 8A.

FIG. 8A is a vertical cross-section view of an intermediate structure during a process of forming a PCM switch illustrating an OTS layer 106 over the first electrode 104 according to an embodiment of the present disclosure. FIG. 8B is a top view of the intermediate structure of FIG. 8A. Referring to FIGS. 8A and 8B, a planarization process, such as a chemical mechanical planarization (CMP) process and/or an etching process, may be used to remove portions of the continuous OTS layer 106L from over the upper surface 102 of the first dielectric material layer 101 and provide a discrete OTS layer 106. The OTS layer 106 may have a strip-shape and may extend in a horizontal direction (i.e., hd2 in FIG. 8B) over the upper surface 105 of the first electrode 104. The first dielectric material layer 101 may surround the OTS layer 106 along lateral side surfaces 133*a*, 133*b* of the first dielectric material layer 101. The upper surface 107 of the OTS layer 106 may be coplanar with the upper surface 102 of the first dielectric material layer 101. In some embodiments, a thickness of the OTS layer 106 between the upper surface 105 of the first electrode 104 and the upper surface 107 of the OTS layer 106 may be between about 1 nm and about 1 μm, such as between about 10 nm and about 500 nm, although lesser and greater thicknesses for the OTS layer 106 may also be utilized. In some embodiments, the OTS layer 106 may have a thickness that is greater than about 60 nm, such as greater than about 100 nm. The first electrode 104 and the OTS layer 106 located over the first electrode 104 may form a selector 160 for a PCM switch as described in further detail below.

Referring again to FIGS. 8A and 8B, the OTS layer 106 may be laterally confined along a first horizontal direction hd1 such that side surface 133*a* of the OTS layer 106 and side surface 131*a* of the underlying electrode 104 may form a first continuous surface 135*a* extending along a second horizontal direction hd2, and side surface 133*b* of the OTS layer 106 and side surface 131*b* of the underlying first electrode 104 may form a second continuous surface 135*b* extending along the second horizontal direction hd2. The first continuous surface 135*a* and the second continuous surface 135*b* may each contact the first dielectric material layer 101. In the embodiment shown in FIGS. 8A and 8B, the first continuous surface 135*a* and the second continuous surface 135*b* are each vertical surfaces, although it will be understood that the first continuous surface 135*a* and the second continuous surface 135*b* may be angled or curved surfaces that conform to the shape of the trench 103 (see FIG. 3) previously formed in the first dielectric material layer 101. In other embodiments, one or more of the side surfaces 133*a*, 133*b* of the OTS layer 106 may not be vertically coincident with the corresponding side surface 131*a*, 131*b* of the underlying first electrode 104. In other words, a lateral dimension of the OTS layer 106 along one or more horizontal directions hd1, hd2 may not be equal to the corresponding lateral dimension of the first electrode 104.

Figure 9:
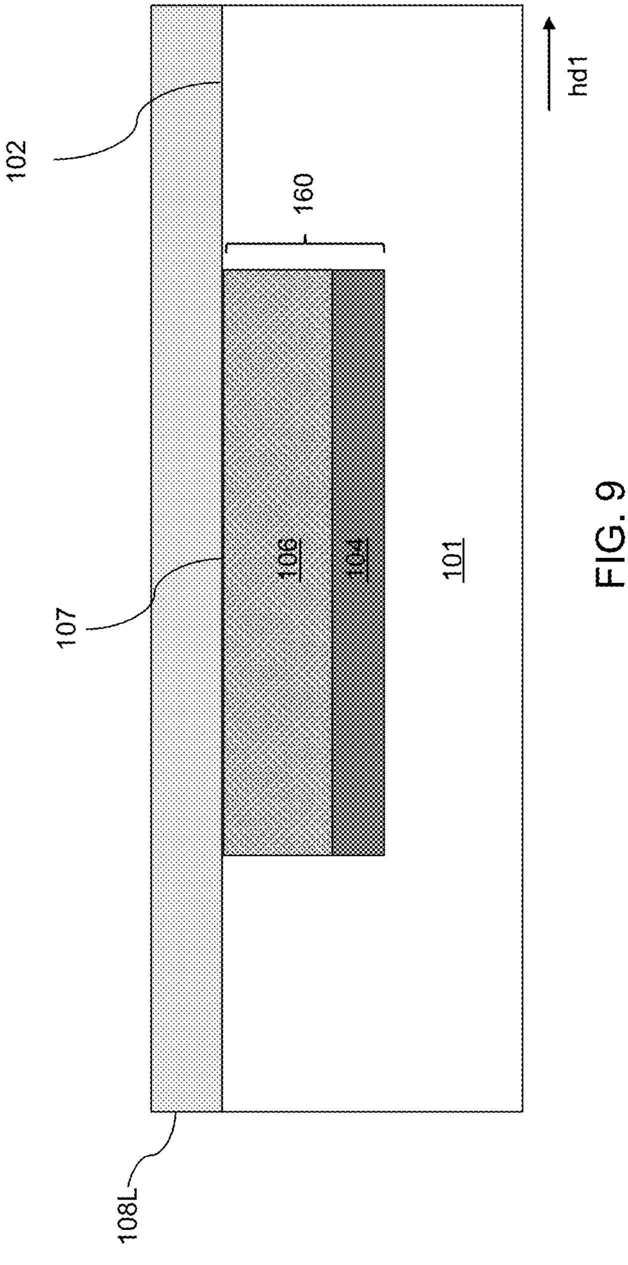
FIG. 9 is a vertical cross-section view of an intermediate structure during a process of forming a PCM switch showing a continuous phase change material (PCM) layer formed over the upper surface of the first dielectric material layer and over the upper surface of the OTS layer according to an embodiment of the present disclosure.

FIG. 9 is a vertical cross-section view of an intermediate structure during a process of forming a PCM switch showing a continuous phase change material (PCM) layer 108L formed over the upper surface 102 of the first dielectric material layer 101 and over the upper surface 107 of the OTS layer 106 according to an embodiment of the present disclosure. Referring to FIG. 9, the continuous PCM layer 108L may be deposited over the upper surface of the first dielectric material layer 101 and over the upper surface 107 of the OTS layer 106 using a suitable deposition process as described above. The continuous PCM layer 108L may include a suitable phase change material having at least two different phases providing different resistivity, such as a high resistivity amorphous phase and a low resistivity crystalline phase. Suitable phase change materials for the continuous PCM layer 108L may include, without limitation, germanium telluride compounds, antimony telluride compounds, germanium antimony telluride (GST) compounds such as $Ge_2Sb_2Te_5$ or $GeSb_2Te_4$, germanium antimony compounds, indium germanium telluride compounds, aluminum selenium telluride compounds, indium selenium telluride compounds, and/or aluminum indium selenium telluride compounds. In some embodiments, the phase change material may be doped using a suitable dopant, such as indium or antimony, or the phase change material may be undoped. Other suitable materials for the continuous PCM layer 108L are within the contemplated scope of disclosure. In some embodiments, the material of the OTS layer 106 may have a higher melting temperature ($T_{melt}$) than the material of the continuous PCM layer 108L.

Figure 10A:
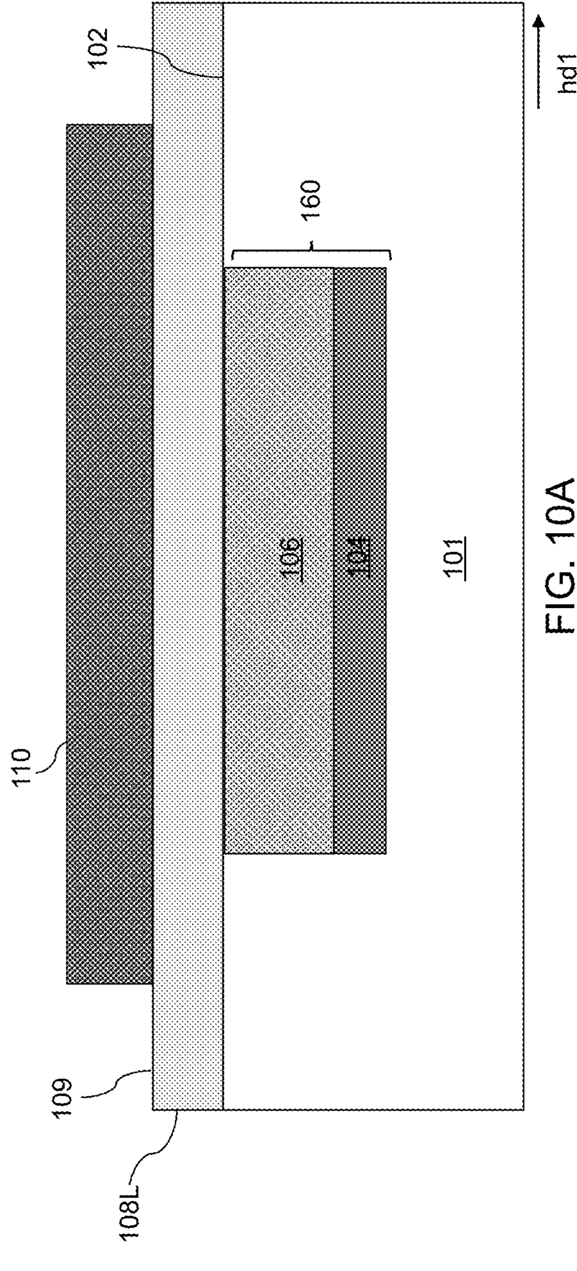
FIG. 10A is a vertical cross-section view of an intermediate structure during a process of forming a PCM switch illustrating a patterned mask over the continuous PCM layer according to an embodiment of the present disclosure.
Figure 10B:
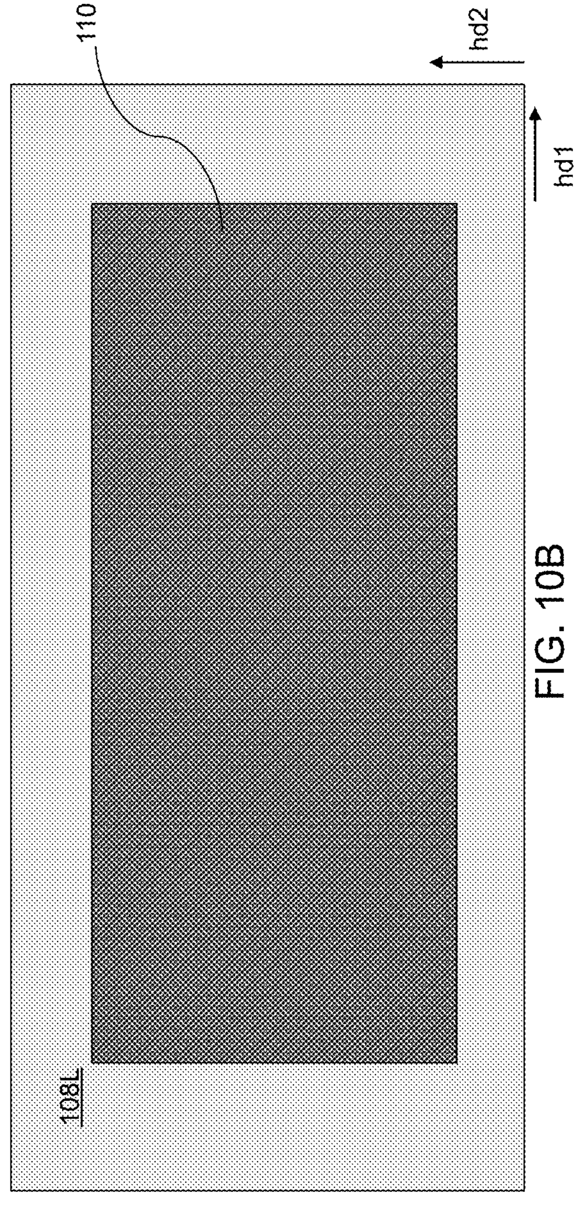
FIG. 10B is a top view of the intermediate structure of FIG. 10A.

FIG. 10A is a vertical cross-section view of an intermediate structure during a process of forming a PCM switch illustrating a patterned mask 110 over the continuous PCM layer 108L according to an embodiment of the present disclosure. FIG. 10B is a top view of the intermediate structure of FIG. 10A. Referring to FIGS. 10A and 10B, the patterned mask 110 may be formed by depositing a layer of photoresist over the upper surface 109 of the continuous PCM layer 108L, and lithographically patterning the photoresist to provide the patterned mask 110. The patterned mask 110 may cover a portion of the continuous PCM layer 108L overlying the OTS layer 106 and the first electrode 104. The portion of the patterned mask 110 overlying the OTS layer 106 and the first electrode 104 may have a greater lateral dimension along a first horizontal direction hd1 than the OTS layer 106 and the first electrode 104 along a first horizontal direction hd1, and may have a lesser lateral dimension than the OTS layer 106 and the first electrode 104 along a second horizontal direction hd2 that is perpendicular to the first horizontal direction hd1.

Figure 11A:
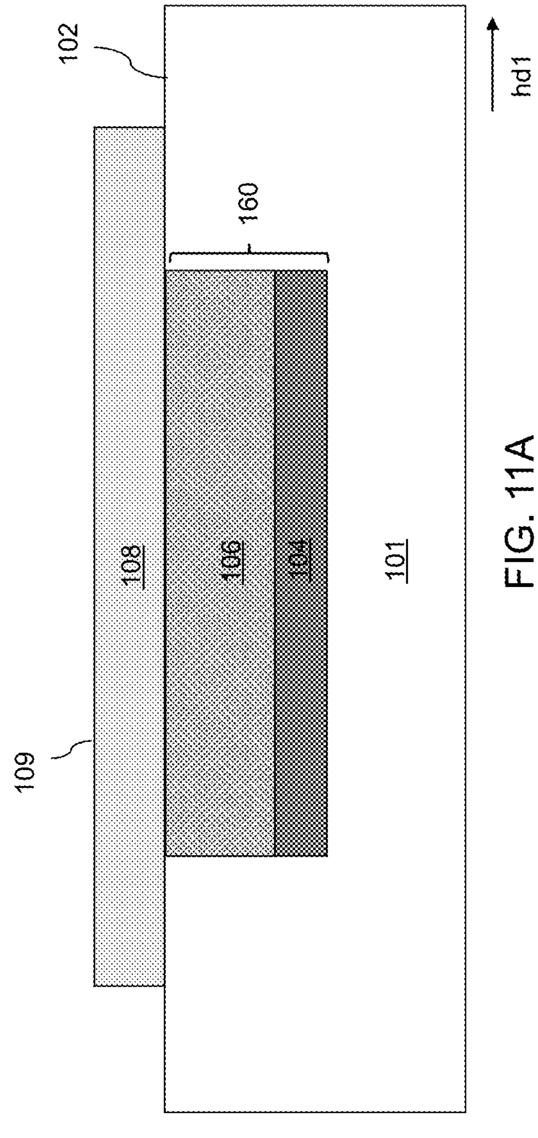
FIG. 11A is a vertical cross-section view of an intermediate structure during a process of forming a PCM switch illustrating a discrete PCM layer over the upper surface of the first dielectric material layer and the upper surface of the OTS layer according to an embodiment of the present disclosure.
Figure 11B:
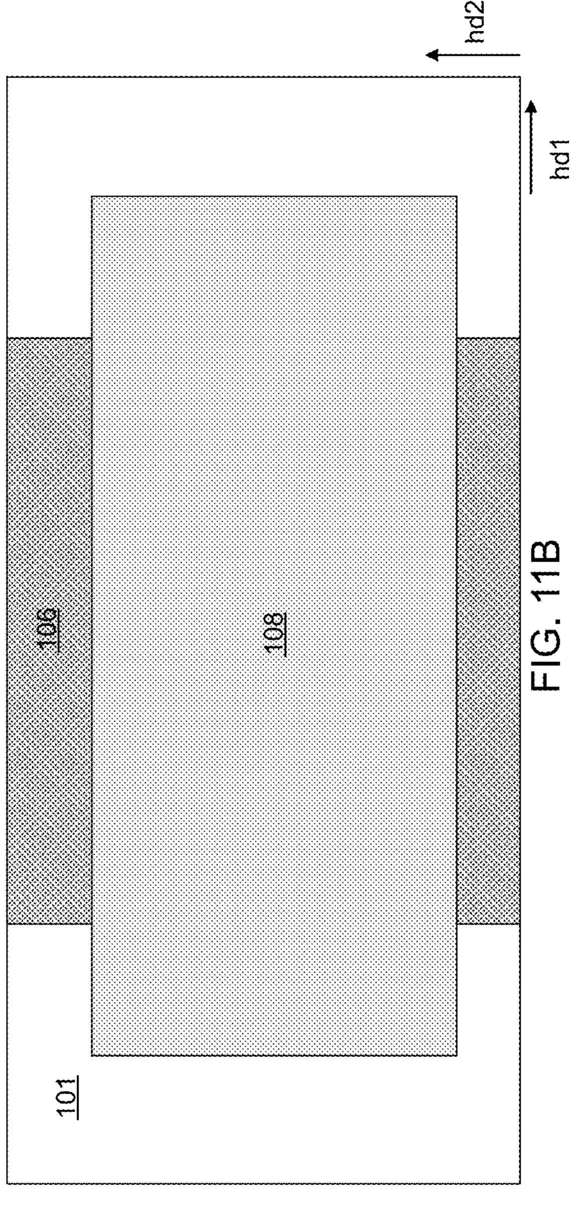
FIG. 11B is a top view of the intermediate structure of FIG. 11A.

FIG. 11A is a vertical cross-section view of an intermediate structure during a process of forming a PCM switch illustrating a discrete PCM layer 108 over the upper surface 102 of the first dielectric material layer 101 and the upper surface 107 of the OTS layer 106 according to an embodiment of the present disclosure. FIG. 11B is a top view of the intermediate structure of FIG. 11A. Referring to FIGS. 11A and 11B, an etching process, such as an anisotropic etching process, may be performed to remove portions of the continuous PCM layer 108L that are exposed through the patterned mask 110 and provide a discrete PCM layer 108 over the upper surface 102 of the first dielectric material layer 101 and the upper surface 107 of the OTS layer 106. The etching process may expose the upper surface 102 of the first dielectric material layer 101 and the upper surface 107 of the OTS layer 106 surrounding the PCM layer 108. In various embodiments, the PCM layer 108 may have a greater lateral dimension along the first horizontal direction hd1 than the OTS layer 106 and the first electrode 104, and may have a lesser lateral dimension than the OTS layer 106 and the first electrode 104 along the second horizontal direction hd2. Following the etching process, the patterned mask 110 may be removed using a suitable process, such as via ashing or dissolution using a solvent.

Figure 12:
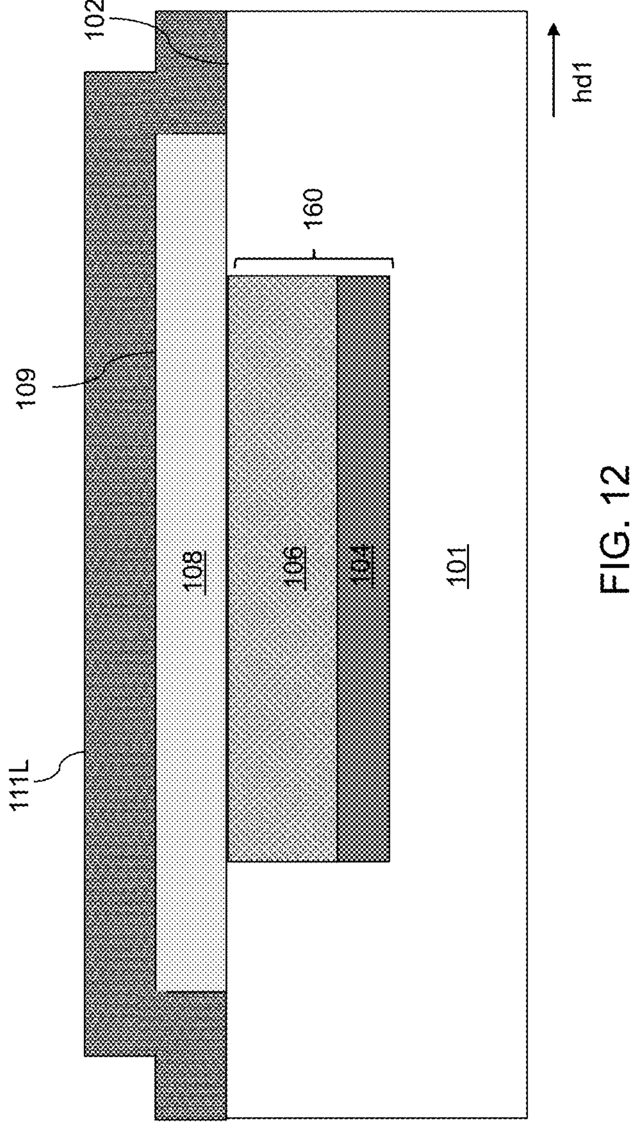
FIG. 12 is a vertical cross-section view of an intermediate structure during a process of forming a PCM switch illustrating a continuous electrode layer over the upper surface of the first dielectric material layer and the upper surface of the OTS layer and over the upper surface and the side surfaces of the PCM layer according to an embodiment of the present disclosure.

FIG. 12 is a vertical cross-section view of an intermediate structure during a process of forming a PCM switch illustrating a continuous electrode layer 111L over the upper surface 102 of the first dielectric material layer 101 and the upper surface 107 of the OTS layer 106 and over the upper surface 109 and the side surfaces of the PCM layer 108 according to an embodiment of the present disclosure. Referring to FIG. 12, the continuous electrode layer 111L may be formed by depositing an electrically conductive material over the exposed upper surfaces of the first dielectric material layer 101 and the OTS layer 106 and over the upper surface and side surfaces of the PCM layer 108. The continuous electrode layer 111L may include a metallic material having relatively low electrical resistivity, such as tungsten, tungsten nitride, nickel silicide, and/or aluminum. Other suitable materials for the continuous electrode layer 111L are within the contemplated scope of disclosure. The continuous electrode layer 111L may be deposited using a suitable deposition process as described above.

Figure 13A:
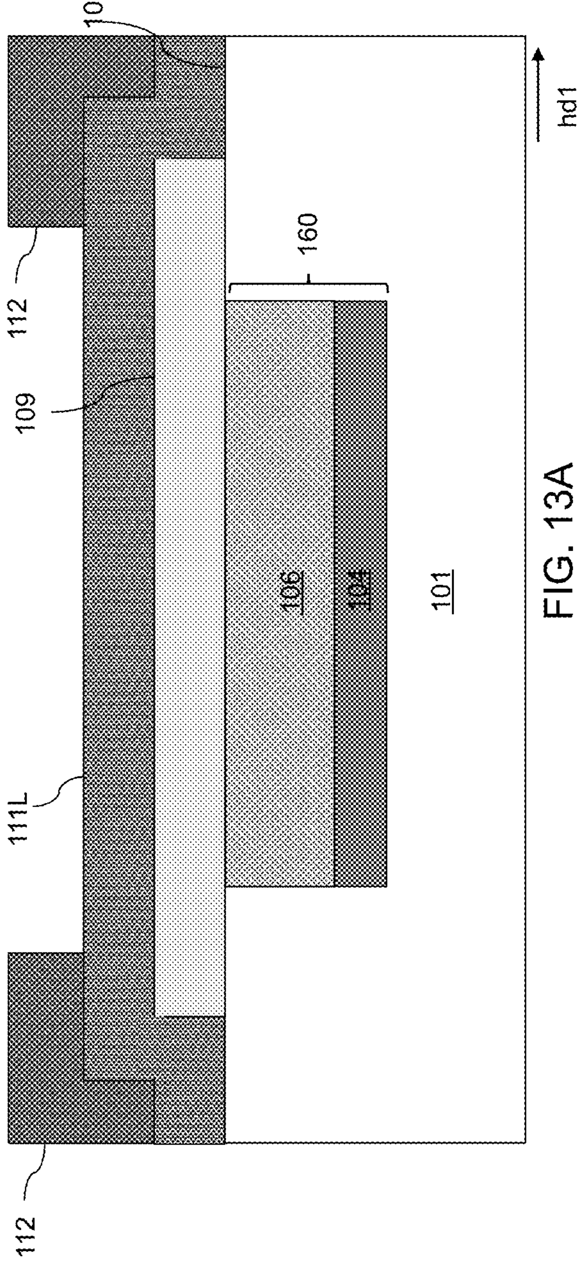
FIG. 13A is a vertical cross-section view of an intermediate structure during a process of forming a PCM switch illustrating a patterned mask over the continuous electrode layer according to an embodiment of the present disclosure.
Figure 13B:
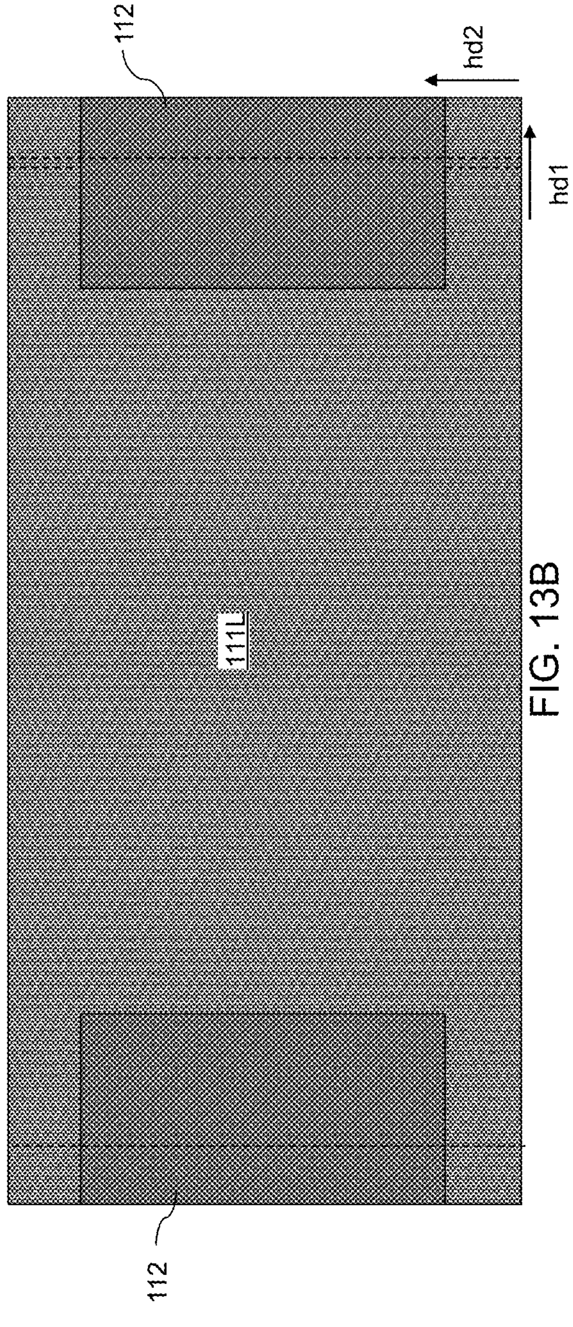
FIG. 13B is a top view of the intermediate structure of FIG. 13A.

FIG. 13A is a vertical cross-section view of an intermediate structure during a process of forming a PCM switch illustrating a patterned mask 112 over the continuous electrode layer 111L according to an embodiment of the present disclosure. FIG. 13B is a top view of the intermediate structure of FIG. 13A. Referring to FIGS. 13A and 13B, the patterned mask 112 may be formed by depositing a layer of photoresist over the continuous electrode layer 111L, and lithographically patterning the photoresist to provide the patterned mask 112. The patterned mask 112 may expose a region of the continuous electrode layer 111L that overlies the first electrode 104 and the OTS layer 106 and may cover portions of the continuous electrode layer 111L that overlie peripheral regions of the PCM layer 108 on opposite sides of the PCM layer 108.

Figure 14A:
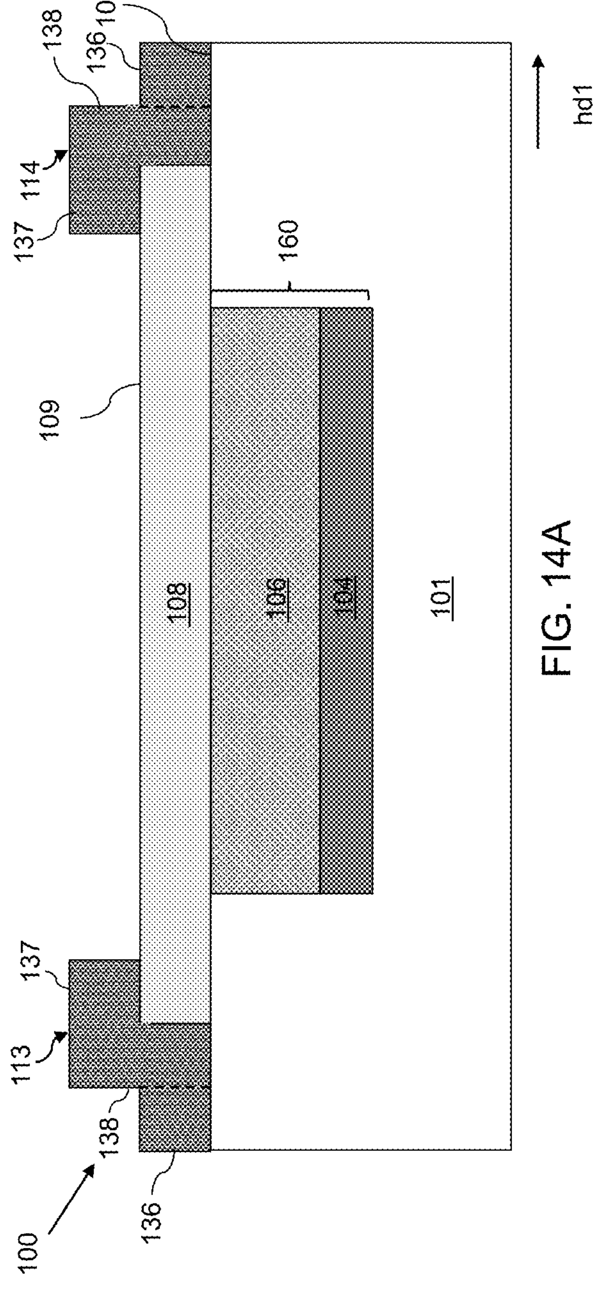
FIG. 14A is a vertical cross-section view of a PCM switch including second and third electrodes and over the upper surface of the first dielectric material layer and the upper surface and side surfaces of the PCM layer according to an embodiment of the present disclosure.
Figure 14B:
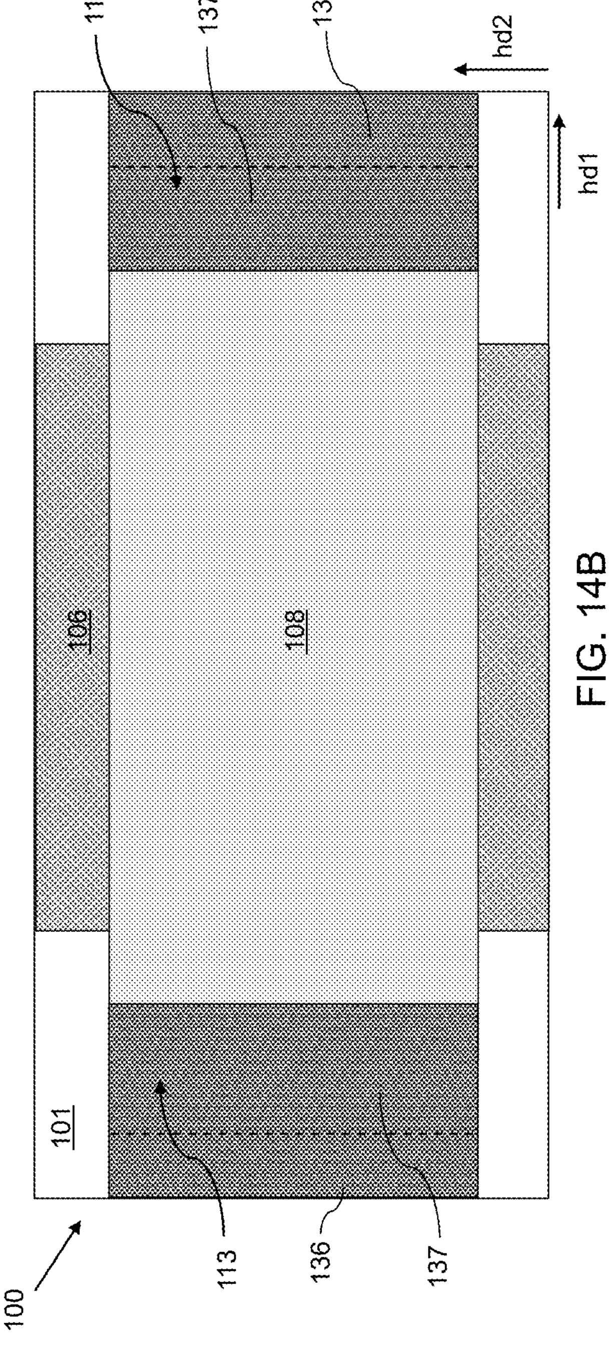
FIG. 14B is a top view of the PCM switch 100 of FIG. 14A.

FIG. 14A is a vertical cross-section view of a PCM switch 100 including second electrode 113 and third electrode 114 over the upper surface 102 of the first dielectric material layer 101 and the upper surface 109 and side surfaces of the PCM layer 108. FIG. 14B is a top view of the PCM switch 100 of FIG. 14A. Referring to FIGS. 14A and 14B, an etching process, such as an anisotropic etching process, may be performed to remove portions of the continuous electrode layer 111L that are exposed through the patterned mask 112 and provide discrete second electrode 113 and third electrode 114 over the upper surface 102 of the first dielectric material layer 101 and the upper surface 109 and side surfaces of the PCM layer 108. The etching process may expose a portion of the upper surface 109 of the PCM layer

108 between the second electrode 113 and the third electrode 114, and the upper surface 102 of the first dielectric material layer 101 and the upper surface 107 of the OTS layer 106 surrounding the PCM layer 108 and the second electrode 113 and the third electrode 114.

Referring again to FIGS. 14A and 14B, the second electrode 113 and third electrode 114 of the PCM switch 100 may each include a first horizontal portion 136 extending over the upper surface 102 of the first dielectric material layer 101, a second horizontal portion 137 extending over the upper surface 109 of the PCM layer 108, and a vertical portion 138 extending over a side surface of the PCM layer 108 between the first horizontal portion 136 and the second horizontal portion 137.

Figure 15A:
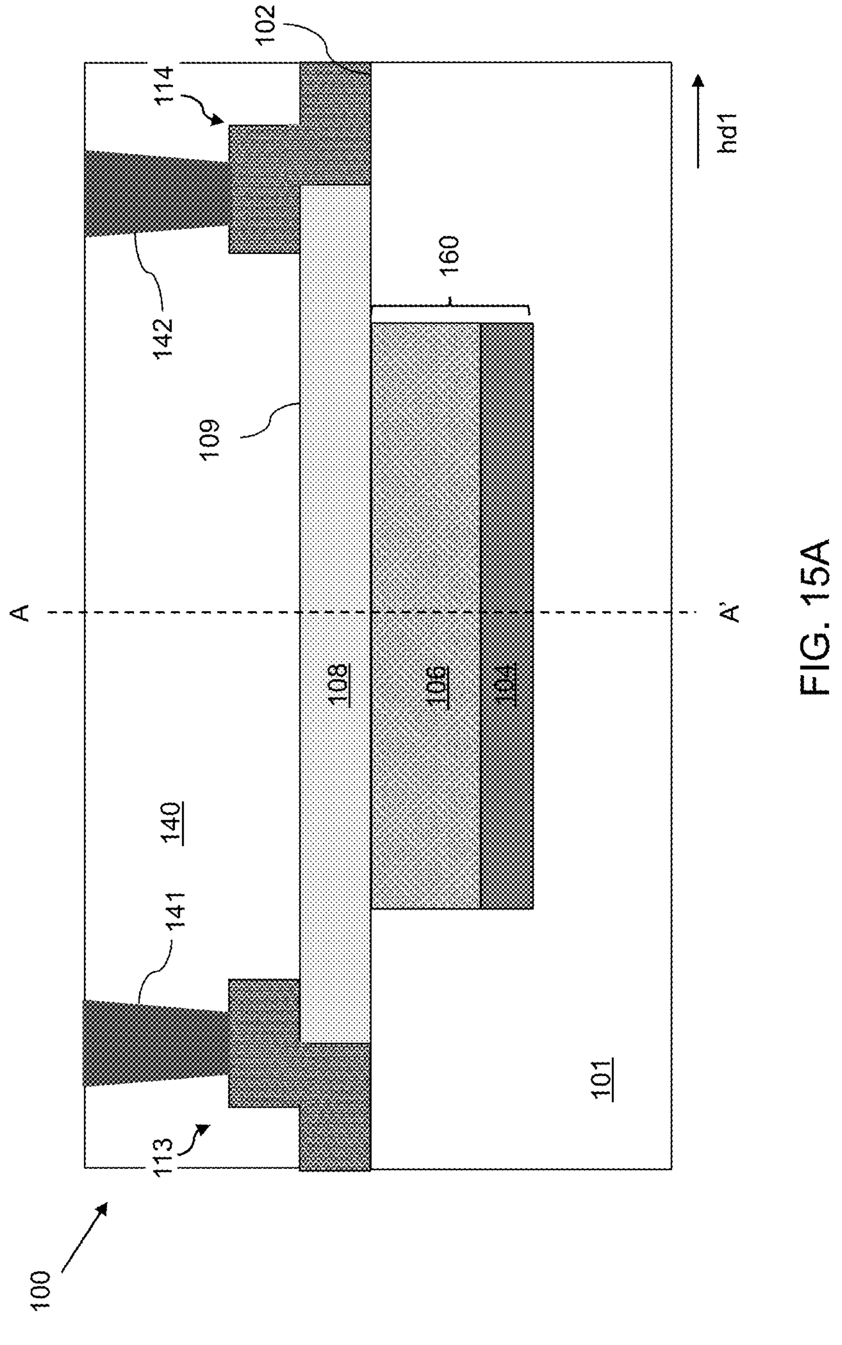
FIG. 15A is a vertical cross-section view of the PCM switch illustrating electrical contacts contacting the second and third electrodes the PCM switch according to an embodiment of the present disclosure.
Figure 15B:
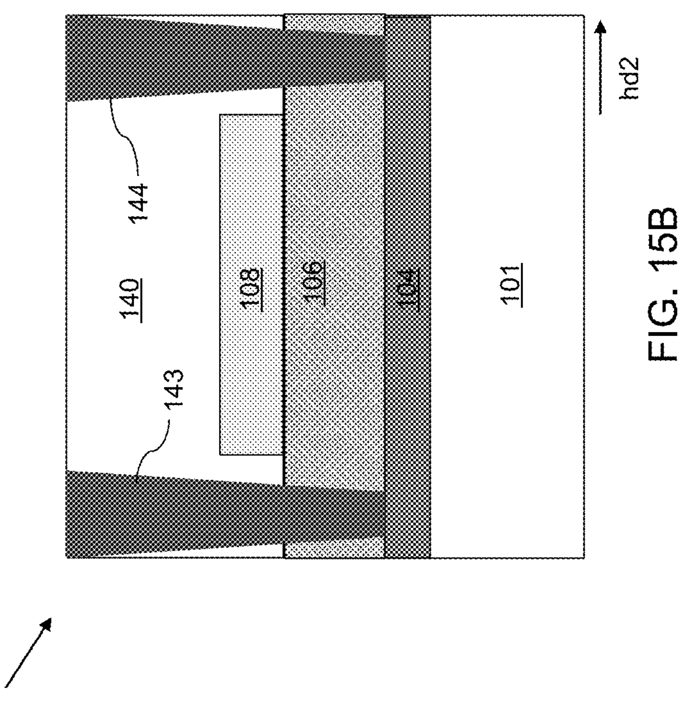
FIG. 15B is a vertical cross-section view of the PCM switch along plane A-A' in FIG. 15A illustrating electrical contacts contacting the first electrode of the PCM switch on opposite sides of the PCM layer according to an embodiment of the present disclosure.

FIG. 15A is a vertical cross-section view of the PCM switch 100 illustrating electrical contacts 141 and 142 contacting the second electrode 113 and the third electrode 114 of the PCM switch 100 according to an embodiment of the present disclosure. FIG. 15B is a vertical cross-section view of the PCM switch 100 along plane A-A' in FIG. 15A illustrating electrical contacts 143 and 144 contacting the first electrode 104 of the PCM switch 100 on opposite sides of the PCM layer 108 according to an embodiment of the present disclosure. Referring to FIGS. 15A and 15B, a second dielectric material layer 140 may be deposited over the second electrode 113 and the third electrode 114 and the PCM layer 108 of the PCM switch 100 and over the exposed upper surfaces 102 and 107 of the first dielectric material layer 101 and the OTS layer 106. The second dielectric material layer 140 may include a suitable dielectric material, such as silicon oxide, undoped silicate glass, a doped silicate glass, organosilicate glass, amorphous fluorinated carbon, porous variants thereof, or combinations thereof. Other suitable dielectric materials are within the contemplated scope of disclosure. In some embodiments, the second dielectric material layer 140 may be composed of the same material as the first dielectric material layer 101. Alternatively, the second dielectric material layer 140 may have a different composition than the first dielectric material layer 101. The second dielectric material layer 140 may be deposited using a suitable deposition method as described above.

Referring to FIG. 15A, the electrical contacts 141 and 142 to the second electrode 113 and the third electrode 114 may be formed by selectively etching the second dielectric material layer 140 through a photolithographically-patterned mask to form a pair of via openings extending through the second dielectric material layer 140 and exposing the second electrode 113 and the third electrode 114 at the bottom of the respective via openings. One or more metallic materials (e.g., a metallic liner layer and a metallic fill material) as described above may be deposited over the upper surface of the second dielectric material layer 140 and within the via openings. The metallic material(s) may be deposited using a suitable deposition process as described above. A planarization process, such as a chemical mechanical planarization (CMP) process, may be used to remove excess metallic material(s) from over the upper surface of the second dielectric material layer 140 to form discrete electrical contacts 141 and 142 (e.g., conductive vias) contacting the second electrode 113 and the third electrode 114 as shown in FIG. 15A.

Referring to FIG. 15B, one or more electrical contacts 143 and 144 to the first electrode 104 may be formed by performing an etching process through a photolithographically-patterned mask to form at least one via opening extending through the second dielectric material layer 140 and the OTS layer 106 and exposing the first electrode 104 at the bottom of the respective via openings. One or more metallic materials (e.g., a metallic liner layer and a metallic fill material) as described above may be deposited over the upper surface of the second dielectric material layer 140 and within each via opening. The metallic material(s) may be deposited using a suitable deposition process as described above. A planarization process, such as a chemical mechanical planarization (CMP) process, may be used to remove excess metallic material(s) from over the upper surface of the second dielectric material layer 140 to form one or more discrete electrical contacts 143 and 144 (e.g., conductive vias) contacting the first electrode 104. The embodiment of FIG. 15B illustrates a pair of electrical contacts 143 and 144 contacting the first electrode 104 on opposite sides of the PCM layer 108. In other embodiments, a single electrical contact 143, 144 or more than two electrical contacts 143, 144 may contact the first electrode 104.

In some embodiments, the one or more electrical contacts143 and 144 to the first electrode 104 may be formed at the same time as the electrical contacts 141 and 142 to the second electrode 113 and third electrode 114 using the same etching, metallic material deposition, and planarization processes. Alternatively, the one or more electrical contacts 143 and 144 to the first electrode 104 may be formed using separate etching, deposition and/or planarization processes than are used to form the electrical contacts 141 and 142 to the second electrode 113 and third electrode 114.

In some embodiments, one or both of the electrical contacts 141 and 142 to the second electrode 113 and third electrode 114 may be formed within the underlying first dielectric material layer 101 (e.g., prior to forming the second electrode 113 and third electrode 114), such that the electrical contacts 141 and/or 142 contact the bottom surface of the respective second electrode 113 and/or third electrode 114. Similarly, in some embodiments, at least one electrical contact 143, 144 to the first electrode 104 may be formed within the underlying first dielectric material layer 101 (e.g., prior to forming the first electrode 104), such that the electrical contact 143, 144 contacts the bottom surface first electrode 104.

Figure 16:
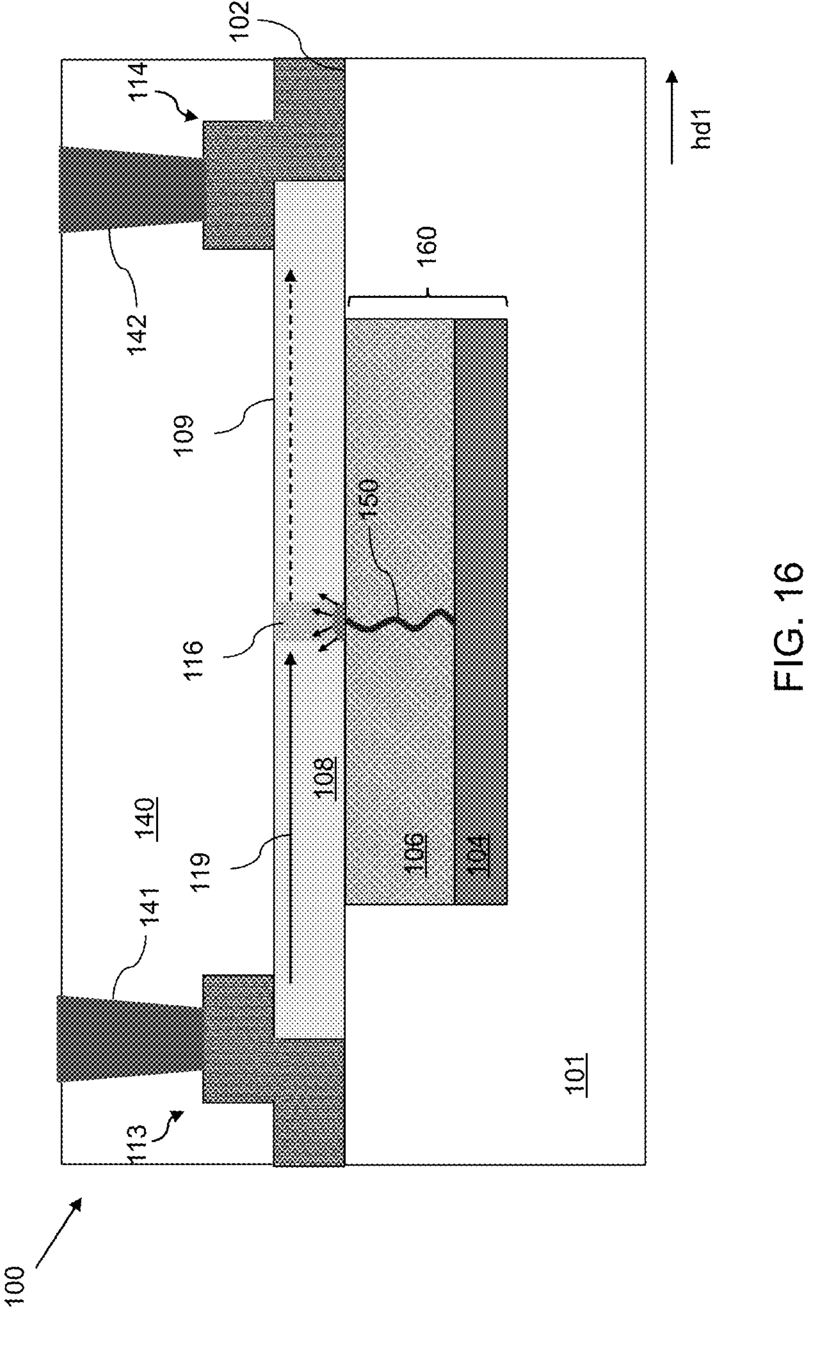
FIG. 16 is a top view of a PCM switch schematically illustrating a process of switching the PCM switch between different resistivity states according to an embodiment of the present disclosure.

FIG. 16 is a vertical cross sectional view of a PCM switch 100 schematically illustrating a process of switching the PCM switch 100 between different resistivity states according to an embodiment of the present disclosure. Referring to FIG. 16, a voltage may be selectively applied to the first electrode 104 via one or more electrical contacts 143 and 144 (see FIG. 15B). The voltage may be a DC voltage that may be applied continuously or in one or more voltage pulses. In some embodiments, a magnitude of the voltage applied to the first electrode 104 may be between about 0.2V and about 6V, although greater and lesser voltages may be utilized. A voltage differential between the voltage applied to the first electrode 104 and the voltage(s) at the second electrode 113 and third electrode 114 may result in an electric field being generated within the OTS layer 106. The OTS layer 106 be maintained in a high resistivity state such that minimal or no current may flow through the OTS layer 106 during normal operating conditions. However, when the voltage applied to the first electrode 104 is greater than a threshold voltage ($V_{TH}$), the resultant electric field generated in the OTS layer 106 may enable electron transport via shallow traps within the OTS layer 106. In regions of the OTS layer 106 that contain a higher number of defects, such as impurities, vacancies and/or interstitial defects in the material of the OTS layer 106, one or more conductive pathways, or "filaments" 150, may begin to form within the OTS layer 106. Current crowding in the one or more filaments 150 may result in localized heating in the OTS layer 106, which may, in turn, result in a region of the PCM layer 108 overlying the filament 150 becoming heated by heat transfer from the OTS layer 106.

By controlling the characteristics of the voltage applied to the first electrode 104 and the resultant localized heating within the OTS layer 106 corresponding to the location of one or more filaments 150, the thermal profile within a portion 116 of the PCM layer 108 overlying the OTS layer 106 (which may also be referred to as the "active region" 116 of the PCM layer 108) may be controlled. In particular, application of a voltage pulse on the first electrode 104 having a relatively short pulse width and rapid pulse falling time may cause rapid heating within the OTS layer 106 and the overlying active region 116 of the PCM layer 108. The active region 116 of the PCM layer 108 may be heated above its melting temperature ($T_{melt}$), which may cause the active region 116 of the PCM layer 108 to transition from a low-resistivity state to a high-resistivity state. The rapid falling time of the voltage pulse may cause the active region 116 of the PCM layer 108 to rapidly quench and avoid recrystallization as it cools. Thus, the active region 116 of the PCM layer 108 may retain its high resistivity state indefinitely following the application of the current pulse.

In contrast, a voltage pulse having a relatively longer pulse width and longer falling time may cause the active region 116 of the PCM layer 108 to be heated to a temperature above its crystallization temperature ($T_{crys}$), but below its melting temperature ($T_{melt}$), causing the active region 116 of the PCM layer 108 to undergo crystal nucleation, while the long falling time of the current pulse may promote crystal growth in the active region 116 of the PCM layer 108 as it gradually cools, thereby causing the active region 116 of the PCM layer 108 to transition from a high-resistivity state to a low-resistivity state. The active region 116 of the PCM layer 108 may retain this low resistivity state indefinitely until the application of a subsequent current pulse that is configured to transition the active region 116 to a high-resistivity state.

In operation of the PCM switch 100 shown in FIG. 16, an input signal, such as a radiofrequency (RF) signal, may be transmitted to the second electrode 113 via electrical contact 141. In instances in which the active region 116 of the PCM layer 108 is in a low-resistivity state, the PCM switch 100 is "On," and the signal may be transmitted across the PCM layer 108 to the third electrode 114 and the electrical contact 142, as schematically indicated by arrow 119. In instances in which the active region 116 of the PCM layer 108 is in a high-resistivity state, the PCM switch 100 is "Off," and the signal transmission to the third electrode 114 and electrical contact 142 may be blocked.

In various embodiments, the material of the OTS layer 106 may differ from the material of the PCM layer 108 with respect to their melting temperatures (Tmelt) and/or other properties such that during the switching processes for transitioning the active region 116 of the PCM layer 108 between a high-resistivity state and a low-resistivity state, the OTS layer 106 may be inhibited from transitioning from a high-resistivity state to a low-resistivity state. Accordingly, the OTS layer 106 may be maintained indefinitely in a high resistive state, which may help to provide a low leakage current in the selector 160 of the PCM switch 100.

In various embodiments, the formation of one or more filaments 150 and the resultant heating of the OTS layer 106 and the overlying PCM layer 108 may be localized within a region of the OTS layer 106 that includes a relatively high number of defects. Thus, the active region 116 of the PCM layer 108 that is switchable between a low resistivity state and a high resistivity state may be relatively small (i.e., laterally confined). This may be contrasted with other PCM switches 100 that include a selector that utilizes joule heating (e.g., via a heater pad located below the PCM layer 108) to switch the resistivity state of the PCM layer 108. In such PCM switches 100, the active region 116 may encompass a relatively larger area of the PCM layer 108, including an entire portion of the PCM layer 108 overlying the heater pad and/or a thermally-conductive electrically insulating layer disposed between the heater pad and the PCM layer 108. Accordingly, in an embodiment PCM switch 100 that includes a selector 160 having an OTS layer 106 as shown in FIG. 16, significantly less power may be required to switch the active region 116 of the PCM layer 108 between a high resistivity state and a low resistivity state. In addition, the switching time for switching the active region 116 of the PCM layer 108 between a high resistivity state and a low resistivity state may be small, such as 20 nanoseconds or less.

In some embodiments, the one or more electrical contacts 143 and 144 to the first electrode 104 may be electrically coupled to control circuitry configured to selectively control the application of a voltage to the first electrode 104 and thereby control (i.e., program) the resistance state of the active region 116 of the PCM layer 108. For example, one or both of the electrical contacts 143 and 144 may be coupled to one or more transistors 701 via metal interconnect structures (612, 618, 622, 628, 631, 638, 642, 648) as shown in FIG. 1.

Figure 17:
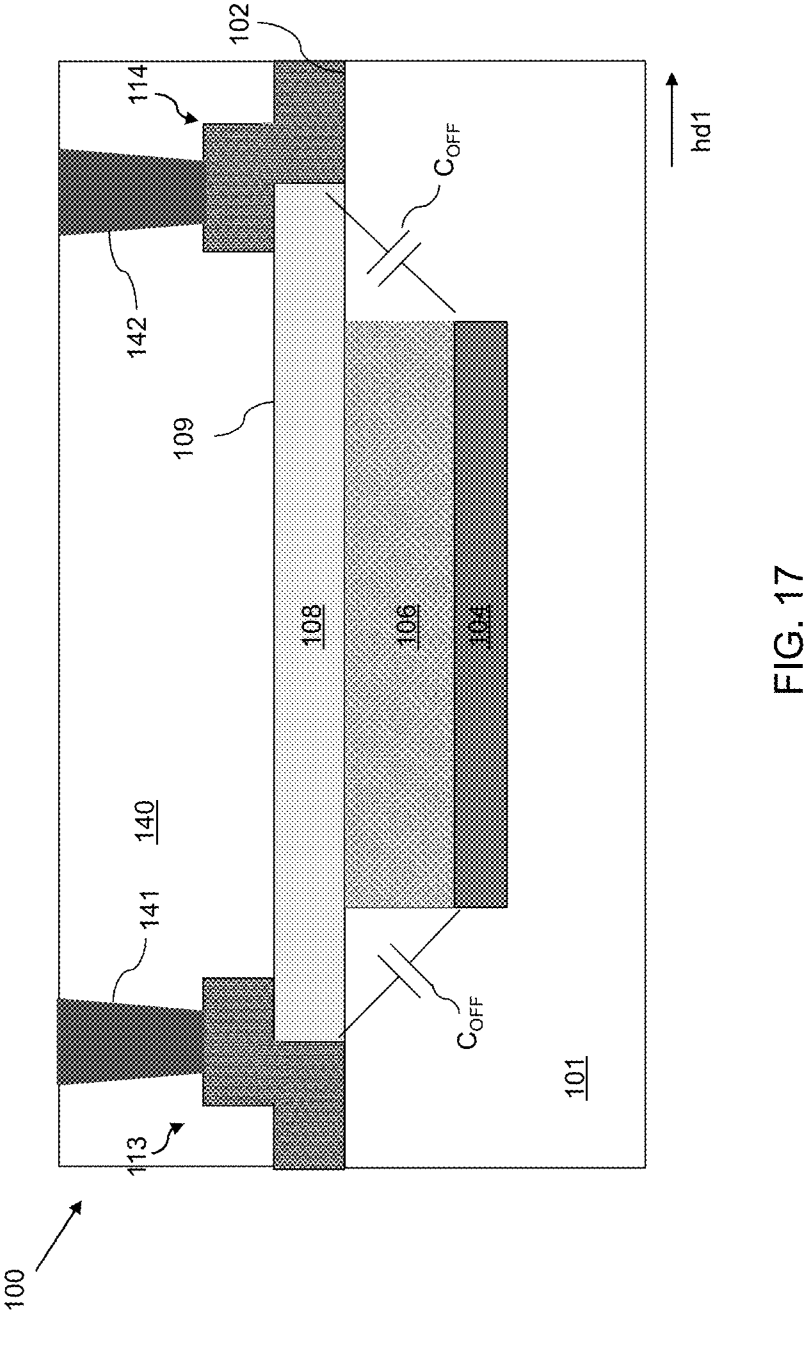
FIG. 17 is a vertical cross-section view schematically illustrating the $C_{OFF}$ characteristics of a PCM switch according to an embodiment of the present disclosure.

FIG. 17 is a vertical cross-section view of a PCM switch 100 according to an embodiment of the present disclosure schematically illustrating the $C_{OFF}$ characteristics of the PCM switch 100. The $C_{OFF}$ of the PCM switch 100 is the parasitic capacitance between the first electrode 104 and the second electrode 113 and the third electrode 114. As discussed above, high isolation is desirable for RF switch performance, and the $C_{OFF}$ is inversely related to the isolation characteristics of the PCM switch. Thus, the lower the $C_{OFF}$ value of the switch, the better the switch performance.

As discussed above, other PCM switches typically have a selector that includes a heater pad and a thermally-conductive electrically insulating layer disposed between the heater pad and the PCM layer. To switch the PCM switch between "On" and "Off" states, the heater pad indirectly heats the PCM layer through the insulating layer to cause the active region of the PCM layer to transition between low resistivity and high resistivity states. To ensure that the PCM layer receives a sufficient amount of thermal energy to induce a transition between low resistivity and high resistivity states, the insulating layer between the heater pad and the PCM layer is typically relatively thin, such as 60 nm or less. However, the capacitance of the switch, $C_{OFF}$, may be expressed as εA/d, where A is the area of overlap between the conductors (i.e., electrodes 104, 113 and 114), ε is the dielectric constant of the material between the conductors, and d is the thickness of the material between the conductors. Thus, providing a thin layer of insulating material between the heater pad and the PCM layer may increase the parasitic capacitance $C_{OFF}$ resulting in poor isolation characteristics for the switch.

In contrast, in an embodiment PCM switch 100 such as shown in FIG. 17, the selector 160 operates via a different mechanism in which a bias voltage applied to the first electrode 104 results in localized heating within portions of the OTS layer 106 that may directly contact the PCM layer 108. Accordingly, the OTS layer 106 may be made relatively thick while still providing sufficient thermal energy to the active region 116 of the PCM layer 108 to induce a transition between a low resistivity state and a high resistivity state. In some embodiments, the thickness of the OTS layer 106 may be greater than 60 nm, including greater than 100 nm, such as between 500 nm and 1 μm. This may result in a lower parasitic capacitance $C_{OFF}$ and improved isolation characteristics for the embodiment PCM switch 100.

Figure 18:
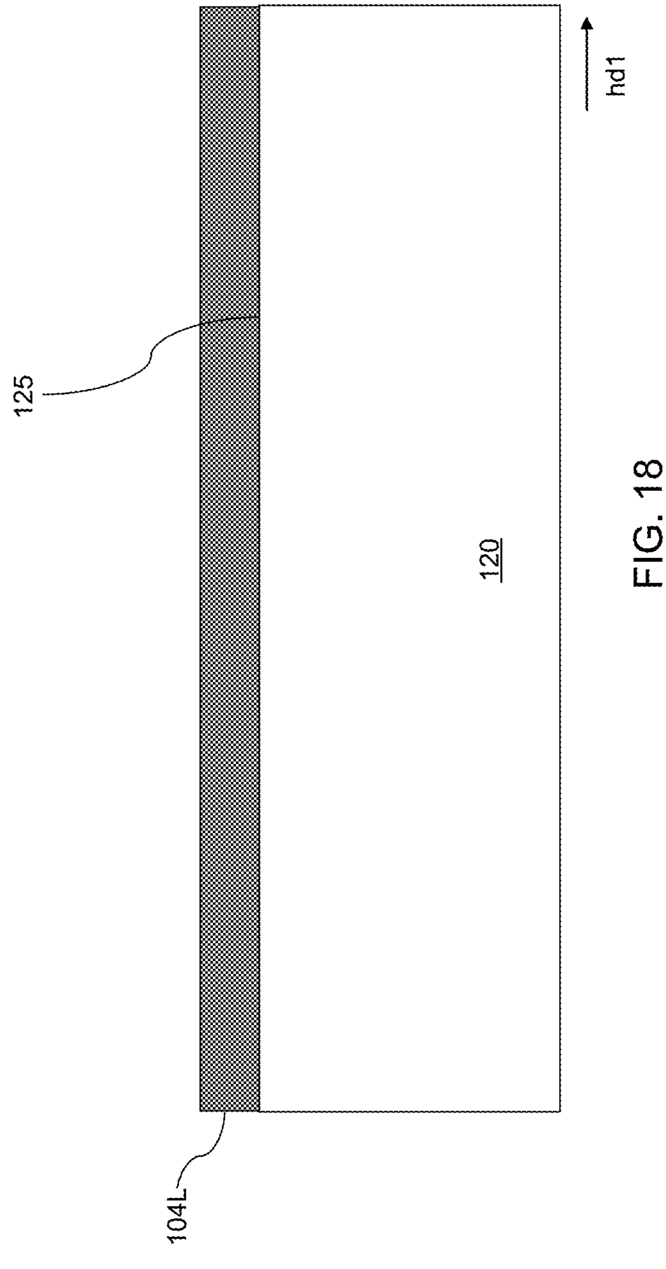
FIG. 18 is a vertical cross-section view of an intermediate structure during a process of forming a PCM switch illustrating a continuous electrode layer deposited over the upper surface of a lower dielectric material layer according to an embodiment of the present disclosure.
Figure 19:
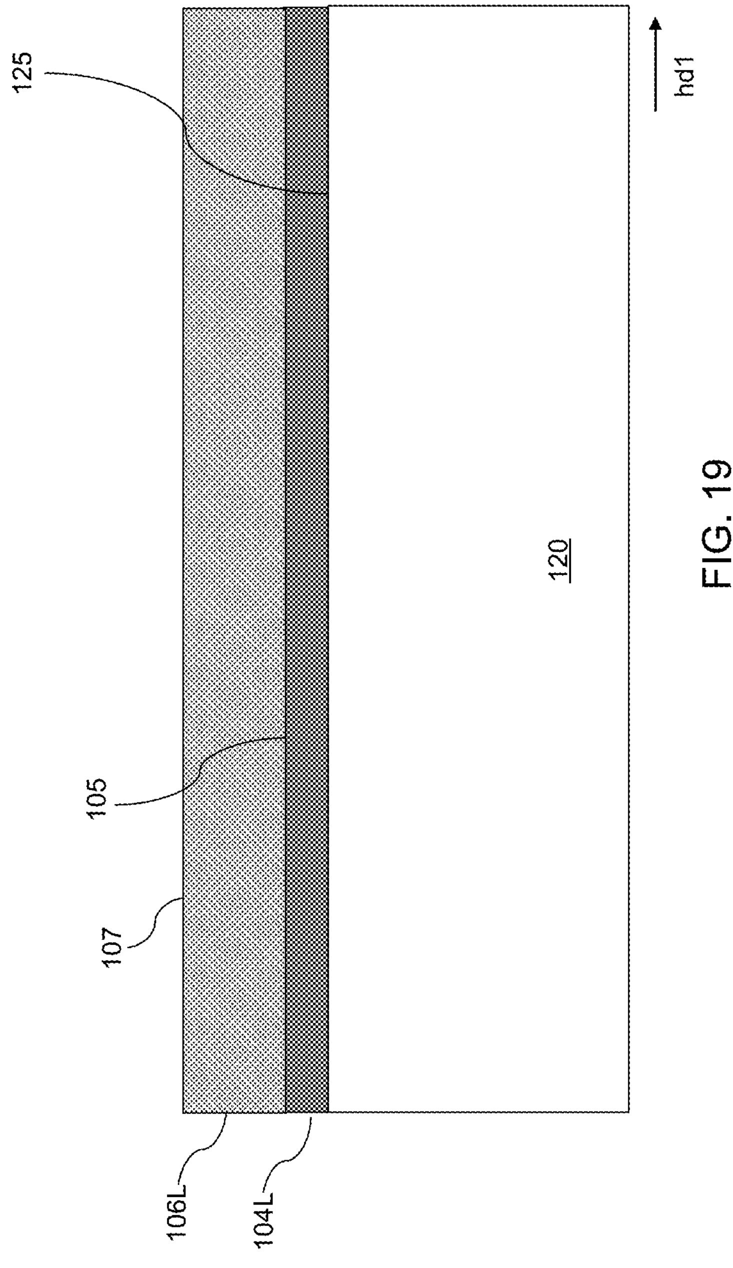
FIG. 19 is a vertical cross-section view of an intermediate structure during a process of forming a PCM switch illustrating a continuous OTS layer deposited over the upper surface of the continuous electrode layer according to an embodiment of the present disclosure.

FIGS. 18-23 are sequential vertical cross-section views of an embodiment structure during a process of forming an embodiment PCM switch illustrating an alternative process for forming a selector 160 that includes a first electrode 104 and an OTS layer 106 over the first electrode 104 according to an embodiment of the present disclosure. Referring to FIG. 18, a continuous electrode layer 104L may be deposited over the upper surface 125 of a lower dielectric material layer 120. Unlike in the intermediate structure shown in FIG. 3, the continuous electrode layer 104L may be deposited over a planar upper surface 125 of the lower dielectric material layer 120 that does not include a trench in the location of a PCM switch to be subsequently formed. Referring to FIG. 19, a continuous OTS layer 106L may be deposited over the upper surface 105 of the continuous electrode layer 104L.

Figure 20:
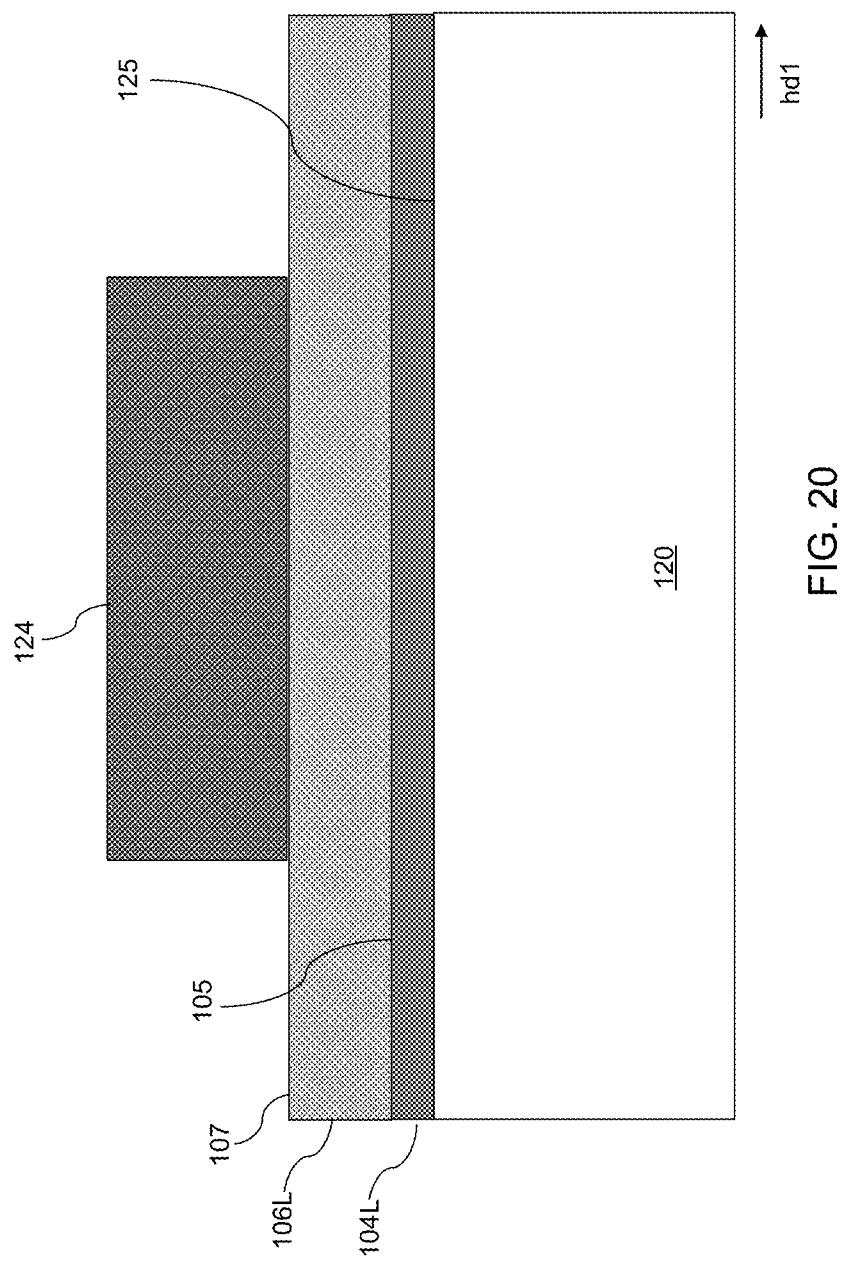
FIG. 20 is a vertical cross-section view of an intermediate structure during a process of forming a PCM switch illustrating a patterned mask over the continuous OTS layer according to an embodiment of the present disclosure.

FIG. 20 is a vertical cross-section view of an exemplary intermediate structure during a process of forming a PCM switch illustrating a patterned mask 124 over the continuous OTS layer 106L according to an embodiment of the present disclosure. Referring to FIG. 20, the patterned mask 124 may be formed by depositing a layer of photoresist over the upper surface 107 of the continuous OTS layer 106L, and lithographically patterning the photoresist to provide the patterned mask 124. The patterned mask 124 may cover a portion of the continuous OTS layer 106L corresponding to the location of a first electrode and discrete OTS layer to be subsequently formed.

Figure 21:
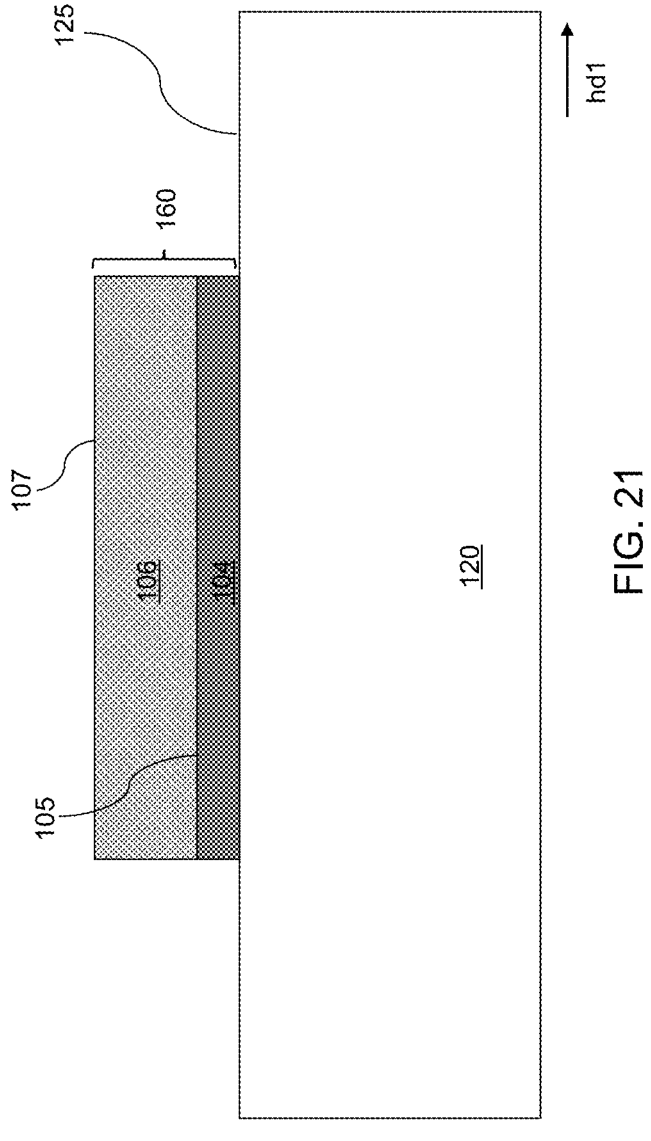
FIG. 21 is a vertical cross-section view of an intermediate structure during a process of forming a PCM switch illustrating a first electrode formed over the upper surface of the lower dielectric material layer, and an OTS layer over the upper surface of the first electrode according to an embodiment of the present disclosure.

FIG. 21 is a vertical cross-section view of an exemplary intermediate structure during a process of forming a PCM switch illustrating a first electrode 104 formed over the upper surface 102 of the lower dielectric material layer 120, and an OTS layer 106 over the upper surface of the 105 of the first electrode 104 according to an embodiment of the present disclosure. Referring to FIG. 21, an anisotropic etching process may be performed to etch unmasked portions of the continuous OTS layer 106L and the continuous electrode layer 104L to provide a discrete first electrode 104 over the upper surface 125 of the lower dielectric material layer 120, and a discrete OTS layer 106 over the upper surface of the 105 of the first electrode 104. The OTS layer 106 and the first electrode 104 and may be similar to the embodiment shown in FIG. 8A in that side surface 133*a* of the dielectric OTS layer 106 and side surface 131*a* of the underlying first electrode 104 may form a first continuous surface 135*a*, and side surface 133*b* of the OTS layer 106 and side surface 131*b* of the underlying first electrode 104 may form a second continuous surface 135*b*. The first electrode 104 and the OTS layer 106 over the first electrode 104 may form a selector 160 for a PCM switch. Following the etching process, the patterned mask 121 may be removed using a suitable process, such as via ashing or dissolution using a solvent.

Figure 22:
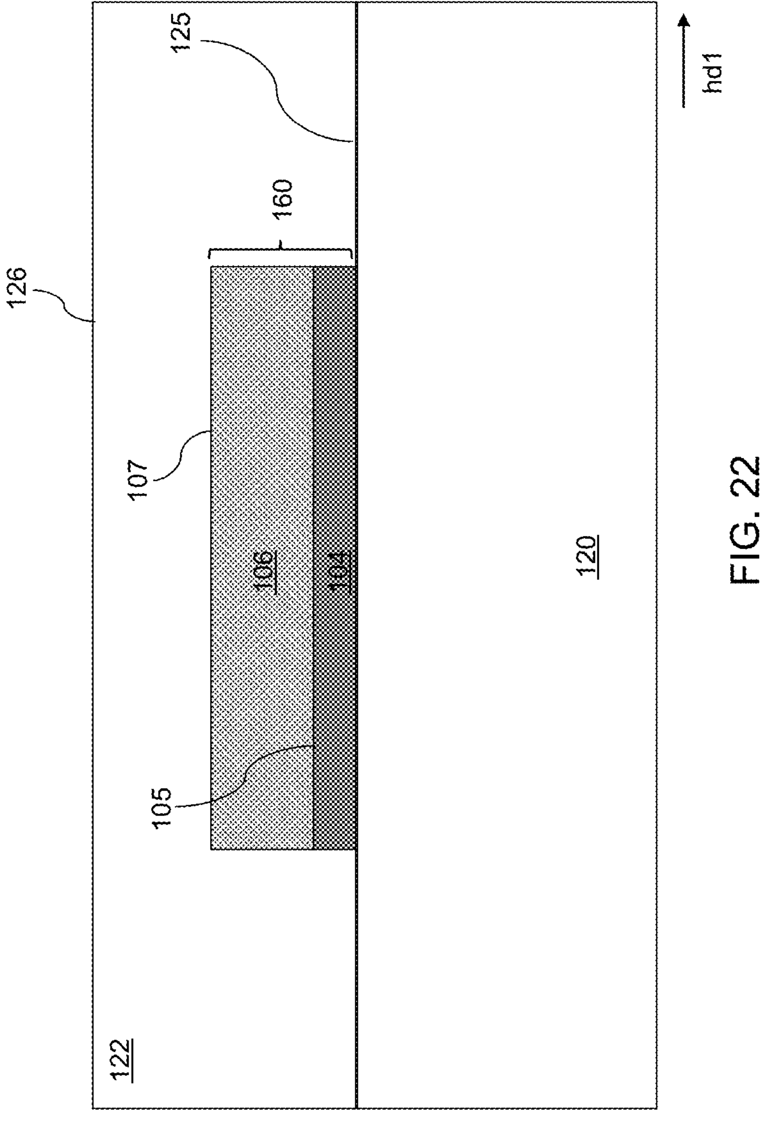
FIG. 22 is a vertical cross-section view of an intermediate structure during a process of forming a PCM switch illustrating an upper dielectric material layer formed over the upper surface of the lower dielectric material layer, over the side surfaces of the first electrode, and over the upper surface and side surfaces of the OTS layer according to an embodiment of the present disclosure.

FIG. 22 is a vertical cross-section view of an exemplary intermediate structure during a process of forming a PCM switch illustrating an upper dielectric material layer 122 formed over the upper surface 125 of the lower dielectric material layer 120, over the side surfaces 131*a* and 131*b* of the first electrode 104, and over the upper surface 107 and side surfaces 133*a* and 133*b* of the OTS layer 106 according to an embodiment of the present disclosure. Referring to FIG. 22, the upper dielectric material layer 122 may include a suitable dielectric material and may be deposited using a suitable deposition process as described above. In some embodiments, the upper dielectric material layer 122 may have the same composition as the lower dielectric material layer 120. Alternatively, the upper dielectric material layer 122 may have a different composition than the lower dielectric material layer 120.

Figure 23:
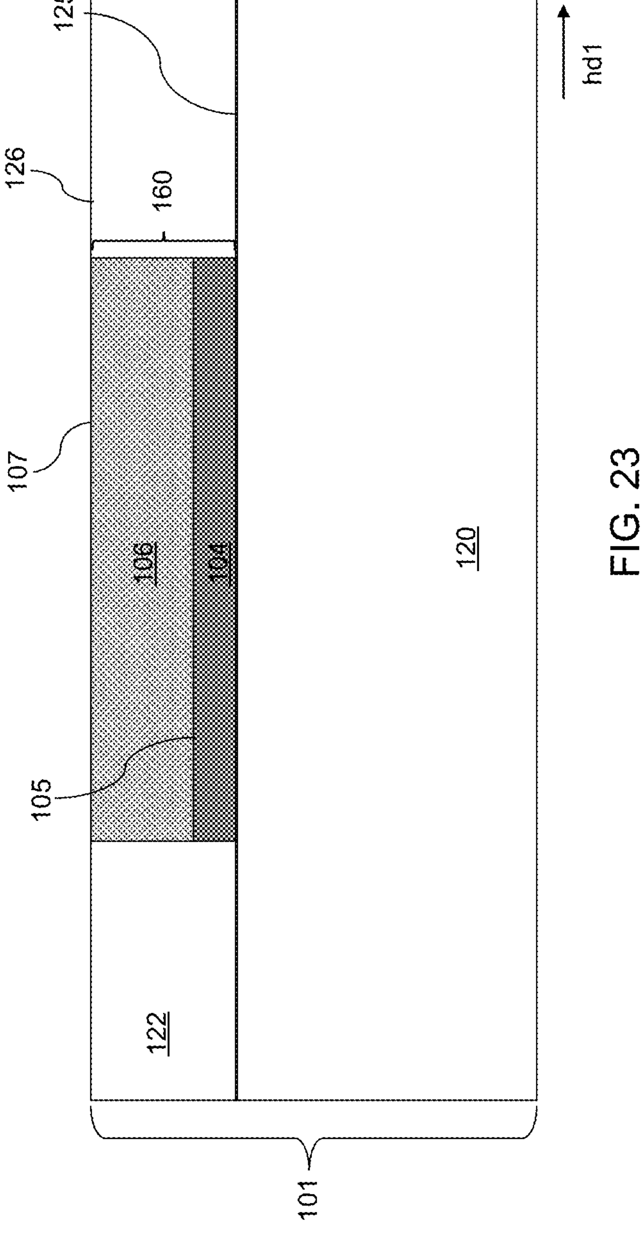
FIG. 23 is a vertical cross-section view of an intermediate structure during a process of forming a PCM switch following a planarization process that removes a portion of the upper dielectric material layer from over the upper surface of the OTS layer according to an embodiment of the present disclosure.

FIG. 23 is a vertical cross-section view of an exemplary intermediate structure during a process of forming a PCM switch following a planarization process that removes a portion of the upper dielectric material layer 122 from over the upper surface 107 of the OTS layer 106 according to an embodiment of the present disclosure. Referring to FIG. 23, a planarization process, such as a chemical mechanical planarization (CMP) may be used to remove a portion of the upper dielectric material layer 122 from over the upper surface 107 of the OTS layer 106. Following the planarization process, the upper surface 126 of the upper dielectric material layer 122 may be co-planar with the upper surface 107 of the OTS layer 106. The lower dielectric material layer 120 and the upper dielectric material layer 122 may together form a first dielectric material layer 101 such as shown in FIGS. 8A and 8B, where the first dielectric material layer 101 may contact the lower surface of the first electrode 104 and may laterally surround the first electrode 104 and the OTS layer 106.

The processing steps described above with reference to FIGS. 9-15B may then be performed to form a PCM switch 100 in accordance with an embodiment of the present disclosure.

Figure 24:
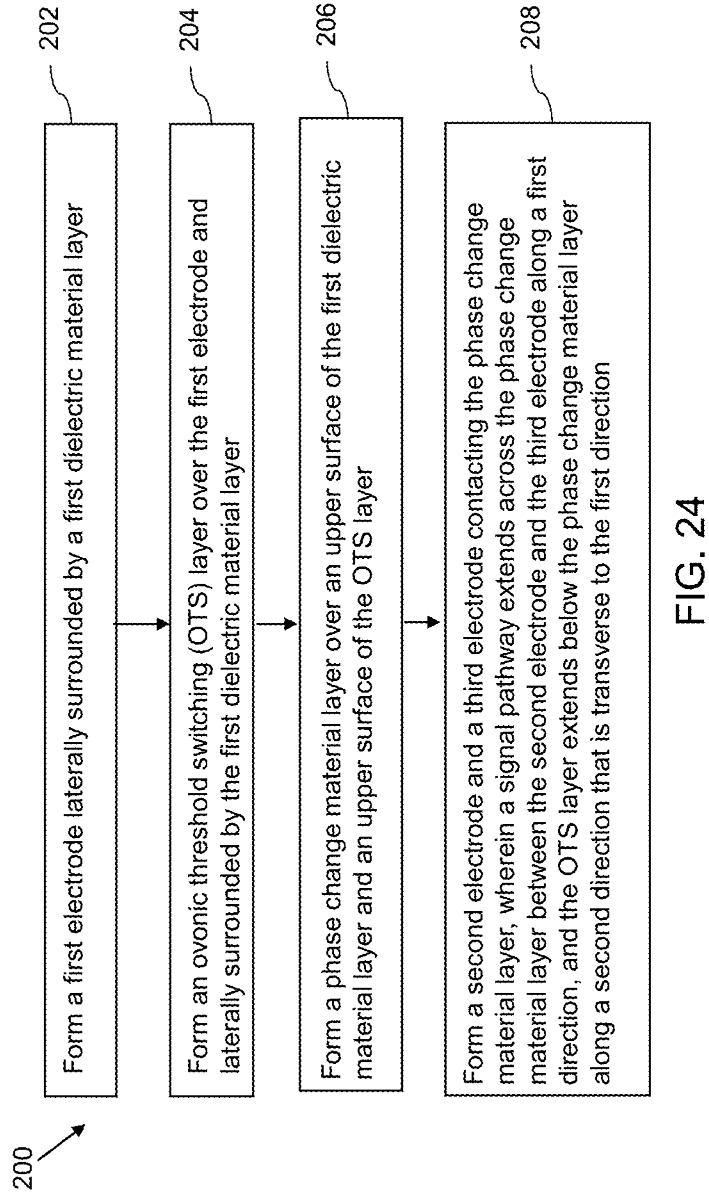
FIG. 24 is a flowchart illustrating a method of fabricating a PCM switch according to an embodiment of the present disclosure.

FIG. 24 is a flowchart illustrating a method 200 of fabricating a PCM switch 100 according to an embodiment of the present disclosure. Referring to FIGS. 2-6, 18-21 and 24, in step 202 of embodiment method 200, a first electrode 104 may be formed, where the first electrode 104 may be laterally surrounded by a first dielectric material layer 101.

Referring to FIGS. 7-8B and 19-24, in step 204 of embodiment method 200, an ovonic threshold switching (OTS) layer 106 may be formed over the first electrode 104 and laterally surrounded by the first dielectric material layer 101.

In some embodiments, as shown in FIGS. 2-8B, the first electrode 104 may be formed by forming a trench 103 in the first dielectric material layer 101, depositing a continuous electrode layer 104L over upper surface 102 of the first dielectric material layer 101 and within the trench 103, and performing a planarization process to remove portions of the continuous electrode layer 104L from over the upper surface 102 of the first dielectric material layer 101 to provide a first electrode 104 laterally surrounded by the first dielectric material layer 101. The OTS layer 106 may be formed by performing a recess etch to vertically recess the upper surface 105 of the first electrode 104 relative to the upper surface 102 of the first dielectric material layer 101, depositing a continuous OTS layer 106L over the upper surface 102 of the first dielectric material layer 101 and over the upper surface 105 of the first electrode 104, and performing a planarization process to remove portions of the continuous OTS layer 106L from over the upper surface 102 of the first dielectric material layer 101 to provide an OTS layer 106 over the upper surface 105 of the first electrode 104.

In other embodiments, as shown in FIGS. 18-23, the first electrode 104 and the OTS layer 106 may be formed by depositing a continuous electrode layer 104L over the upper surface 125 of a lower dielectric material layer 120, depositing a continuous OTS layer 106L over the upper surface 105 of the continuous electrode layer 104L, etching the continuous OTS layer 106L and the continuous electrode layer 104L through a patterned mask 124 to provide a discrete first electrode 104 over the upper surface 125 of the lower dielectric material layer 120 and a discrete OTS layer 106 over the upper surface 105 of the first electrode 104, forming an upper dielectric material layer 122 over the upper surface 125 of the lower dielectric material layer 120, over the sides 131*a*, 131*b* of the first electrode 104, and over the sides 133*a*, 133*b* and upper surface 107 of the OTS layer 106, and performing a planarization process to remove the upper dielectric material layer 122 from over the upper surface 107 of the OTS layer 106 to provide the first electrode 104 and the OTS layer 106 embedded within a first dielectric layer 101 formed by the lower dielectric material layer 120 and the upper dielectric material layer 122.

Referring to FIGS. 9-11B and 24, in step 206 of embodiment method 200, a phase change material layer 108 may be formed over an upper surface 102 of the first dielectric material layer 101 and an upper surface 107 of the OTS layer 106. Referring to FIGS. 12-14B and 24, in step 208 of embodiment method 200, a second electrode 113 and a third electrode 114 may be formed contacting the phase change material layer 108, where a signal pathway extends across the phase change material layer 108 between the second electrode 113 and the third electrode 114 along a first direction hd1, and the OTS layer 106 extends below the phase change material layer 108 along a second direction hd2 that is transverse to the first direction hd1.

Referring to all drawings and according to various embodiments of the present disclosure, a phase change material (PCM) switch 100 includes a first electrode 104, a phase change material layer 108, an ovonic threshold switching (OTS) layer 106 located between the first electrode 104 and the phase change material layer 108, a second electrode 113 contacting a first surface of the phase change material layer 108, and a third electrode 114 contacting the first surface of the phase change material layer 108, where a signal pathway extends through the phase change material layer 108 between the second electrode 113 and the third electrode 114 along a first direction hd1, and the OTS layer 106 contacts a second surface of the phase change material layer 108 that is opposite the first surface.

In one embodiment, the OTS layer 106 extends across a width of the phase change material layer 108 along a second direction hd2 that is perpendicular to the first direction hd1.

In another embodiment, the PCM switch further includes a first dielectric material layer 101 laterally surrounding the first electrode 104 and the OTS layer 106, the phase change material layer 108 extending over an upper surface 102 of the first dielectric material layer 101 and an upper surface 107 of the OTS layer 106.

In another embodiment, the PCM switch further includes a second dielectric material layer 140 over the first dielectric material layer 101, the phase change material layer 108, the OTS layer 106, and the second electrode 113 and the third electrode 114, and a first pair of electrical contacts 141, 142 extend through the second dielectric layer 140 and contact the second electrode 113 and the third electrode 114.

In another embodiment, the PCM switch further includes one or more electrical contacts 143, 144 extending through the second dielectric material layer 140 and the OTS layer 106 and contacting the first electrode 104.

In another embodiment, the first electrode 104 is configured to apply a bias voltage to the OTS layer 106 such that localized heating occurs within the OTS layer 106.

In another embodiment, the localized heating within the OTS layer 106 heats an active region 116 of the phase change material layer 108 that is located within the signal pathway to cause the active region 116 of the phase change material layer 108 to selectively transition between a low resistivity state and a high resistivity state.

In another embodiment, a switching time for the active region 116 of the phase change material layer 108 to transition between the low resistivity state and the high resistivity state is 20 nanoseconds or less.

In another embodiment, a voltage applied to the first electrode 104 to cause the active region 116 of the phase change material layer 108 to transition between the low resistivity state and the high resistivity state has a magnitude of 0.2 V to 6 V.

In another embodiment, the OTS layer 106 remains in a high resistivity state as the active region 116 of the phase change material layer 108 transitions between the low resistivity state and the high resistivity state.

In another embodiment, the OTS layer 106 includes at least one of a selenium-containing compound, a tellurium-containing compound, and/or a germanium-containing compound.

In another embodiment, the phase change material layer 108 includes at least one of a germanium telluride compound, an antimony telluride compound, a germanium antimony telluride compound, a germanium antimony compound, an indium germanium telluride compound, an aluminum selenium telluride compound, an indium selenium telluride compound, and an aluminum indium selenium telluride compound.

In another embodiment, a thickness of the OTS layer 106 is greater than 100 nm.

In another embodiment, the PCM switch is a radiofrequency (RF) switch.

Another embodiment is drawn to a phase change material (PCM) switch 100 having a selector 160 including a first electrode 104 and an ovonic threshold switching (OTS) layer 106, a phase change material layer 108 in thermal contact with the OTS layer 106, and the second electrode 113 and the third electrode 114, both of which electrically contacting the phase change material layer 108 such that a signal pathway extends through the phase change material layer 108 between the second electrode 113 and the third electrode 114, where the OTS layer 106 is composed of a material having a higher melting temperature than the melting temperature of the material of the phase change material layer 108.

In one embodiment, the OTS layer 106 extends along a width of the phase change material layer 108 transverse to the signal pathway.

In another embodiment, the OTS layer 106 includes at least one of GeSe, GeSeN, GeSeSb, GeSeSbN, ZnTe, AlTe, BCTeN, and BCGaTeO.

Another embodiment is drawn to a method of fabricating a phase change material (PCM) switch 100 that includes forming a first electrode 104 laterally surrounded by a first dielectric material layer 101, forming an ovonic threshold switching (OTS) layer 106 over the first electrode 104 and laterally surrounded by the first dielectric material layer 101, forming a phase change material layer 108 over an upper surface 102 of the first dielectric material layer 101 and an upper surface 107 of the OTS layer 106, and forming a second electrode 113 and a third electrode 114 contacting the phase change material layer 108, where a signal pathway extends across the phase change material layer 108 between the second electrode 113 and the third electrode 114 along a first direction hd1, and the OTS layer 106 extends below the phase change material layer 108 along a second direction hd2 that is transverse to the first direction hd1.

In one embodiment, forming the first electrode 104 includes forming a trench 103 in the first dielectric material layer 101, depositing a continuous electrode layer 104L over the upper surface 102 of the first dielectric material layer 101 and within the trench 103, and performing a planarization process to remove portions of the continuous electrode layer 104L from over the upper surface 102 of the first dielectric material layer 101 to provide a first electrode 104 laterally surrounded by the first dielectric material layer 101, and forming the OTS layer 106 includes performing a recess etch to vertically recess the upper surface 105 of the first electrode 104 relative to the upper surface 102 of the first dielectric material layer 101, depositing a continuous OTS layer 106L over the upper surface 102 of the first dielectric material layer 101 and over the upper surface 105 of the first electrode 104, and performing a planarization process to remove portions of the continuous OTS layer 106L from over the upper surface 102 of the first dielectric material layer 101 to provide an OTS layer 106 over the upper surface 105 of the first electrode 104.

In another embodiment, forming the first electrode 104 and the OTS layer 106 includes depositing a continuous electrode layer 104L over the upper surface 125 of a lower dielectric material layer 120, depositing a continuous OTS layer 106L over the upper surface 105 of the continuous electrode layer 104L, etching the continuous OTS layer 106L and the continuous electrode layer 104L through a patterned mask 124 to provide a discrete first electrode 104 over the upper surface 125 of the lower dielectric material layer 120 and a discrete OTS layer 106 over the upper surface 105 of the first electrode 104, forming an upper dielectric material layer 122 over the upper surface 125 of the lower dielectric material layer 120, over the sides 131*a*, 131*b* of the first electrode 104, and over the sides 133*a*, 133*b* and upper surface 107 of the OTS layer 106, and performing a planarization process to remove the upper dielectric material layer 122 from over the upper surface 107 of the OTS layer 106 to provide the first electrode 104 and the OTS layer 106 embedded within the first dielectric material layer 101 comprising the lower dielectric material layer 120 and the upper dielectric material layer 122.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a phase change material (PCM) switch, comprising:

forming a first electrode laterally surrounded by a first dielectric material layer;

vertically recessing the upper surface of the first electrode relative to the upper surface of the first dielectric material layer;

forming an ovonic threshold switching (OTS) layer over the first electrode and laterally surrounded by the first dielectric material layer;

forming a phase change material layer over an upper surface of the first dielectric material layer and an upper surface of the OTS layer; and forming a second electrode and a third electrode contacting the phase change material layer, wherein a signal pathway extends across the phase change material layer between the second electrode and the third electrode along a first direction, and the OTS layer extends below the phase change material layer along a second direction that is transverse to the first direction.

2. The method of claim 1, wherein forming the first electrode comprises:

forming a trench in the first dielectric material layer;

depositing a continuous electrode layer over the upper surface of the first dielectric material layer and within the trench; and performing a planarization process to remove portions of the continuous electrode layer from over the upper surface of the first dielectric material layer to provide a first electrode laterally surrounded by the first dielectric material layer, wherein the upper surface of the first electrode is vertically recessed relative to the upper surface of the first dielectric material layer by performing a recess etch, and wherein forming the OTS layer comprises:

depositing a continuous OTS layer over the upper surface of the first dielectric material layer and over the upper surface of the first electrode; and performing a planarization process to remove portions of the continuous OTS layer from over the upper surface of the first dielectric material layer to provide an OTS layer over the upper surface of the first electrode.

3. The method of claim 1, wherein the OTS layer comprises at least one of a selenium-containing compound, a tellurium-containing compound, or a germanium-containing compound.

4. The method of claim 1, wherein the phase change material layer comprises at least one of a germanium telluride compound, an antimony telluride compound, a germanium antimony telluride compound, a germanium antimony compound, an indium germanium telluride compound, an aluminum selenium telluride compound, an indium selenium telluride compound, or an aluminum indium selenium telluride compound.

5. The method of claim 1, wherein the OTS layer is composed of a material having a higher melting temperature than a melting temperature of a material of the phase change material layer.

6. The method of claim 1, wherein a thickness of the OTS layer is greater than 100 nm.

7. The method of claim 1, further comprising forming a second dielectric material layer over the first dielectric material layer, the phase change material layer, the OTS layer, and the second and third electrodes.

8. The method of claim 7, further comprising forming a first pair of electrical contacts extending through the second dielectric material layer and contacting the second electrode and the third electrode.

9. A method of fabricating a phase change material (PCM) switch, comprising:

depositing a continuous electrode layer over an upper surface of a lower dielectric material layer;

depositing a continuous ovonic threshold switching (OTS) layer over an upper surface of the continuous electrode layer;

etching the continuous OTS layer and the continuous electrode layer through a patterned mask to provide a discrete first electrode over the upper surface of the lower dielectric material layer and a discrete OTS layer over an upper surface of the first electrode;

forming an upper dielectric material layer over the upper surface of the lower dielectric material layer, over side surfaces of the first electrode, and over side surfaces and an upper surface of the OTS layer;

performing a planarization process to remove the upper dielectric material layer from over the upper surface of the OTS layer;

forming a phase change material layer over the upper surface of the OTS layer; and forming a second electrode and a third electrode contacting the phase change material layer.

10. The method of claim 9, wherein a side surface of the OTS layer and a side surface of the first electrode form a continuous surface.

11. The method of claim 9, wherein the OTS layer comprises at least one of GeSe, GeSeN, GeSeSb, GeSeSbN, ZnTe, AlTe, BCTeN, or BCGaTeO.

12. The method of claim 9, wherein the OTS layer is composed of a material having a higher melting temperature than a melting temperature of a material of the phase change material layer.

13. The method of claim 9, wherein a thickness of the OTS layer is greater than 100 nm.

14. A method of fabricating a phase change material (PCM) switch, comprising:

forming a first electrode;

forming an ovonic threshold switching (OTS) layer over the first electrode;

forming a phase change material layer over an upper surface of the OTS layer;

forming a second electrode and a third electrode contacting the phase change material layer;

forming a dielectric material layer over the second electrode, the third electrode, and the phase change material layer; and forming one or more electrical contacts extending through the dielectric material layer and the OTS layer and contacting the first electrode.

15. The method of claim 14, further comprising forming electrical contacts extending through the dielectric material layer and contacting the second electrode and the third electrode.

16. The method of claim 14, wherein the PCM switch comprises a radiofrequency (RF) switch.

17. The method of claim 14, wherein a side surface of the OTS layer and a side surface of the first electrode form a continuous surface.

18. The method of claim 14, wherein the OTS layer comprises at least one of a selenium-containing compound, a tellurium-containing compound, or a germanium-containing compound.

19. The method of claim 14, wherein a thickness of the OTS layer is greater than 100 nm.

20. The method of claim 14, wherein the one or more electrical contacts contact the first electrode on opposite sides of the phase change material layer.

* * * * *